United States Patent
Do

(10) Patent No.: US 11,056,489 B2
(45) Date of Patent: Jul. 6, 2021

(54) INTEGRATED CIRCUIT DEVICES INCLUDING VERTICAL FIELD-EFFECT TRANSISTORS (VFETS)

(71) Applicant: Samsung Electronics Co., Ltd., Suwon-si (KR)

(72) Inventor: Jung Ho Do, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/434,245

(22) Filed: Jun. 7, 2019

(65) Prior Publication Data

US 2020/0144260 A1    May 7, 2020

Related U.S. Application Data

(60) Provisional application No. 62/755,675, filed on Nov. 5, 2018.

(51) Int. Cl.
| | | |
|---|---|---|
| H01L 29/66 | (2006.01) | |
| H01L 27/092 | (2006.01) | |
| H01L 23/522 | (2006.01) | |
| H01L 27/02 | (2006.01) | |

(52) U.S. Cl.
CPC ........ H01L 27/092 (2013.01); H01L 23/5226 (2013.01); H01L 27/0207 (2013.01)

(58) Field of Classification Search
CPC ............... H01L 27/092; H01L 23/5225; H01L 27/0207
See application file for complete search history.

(56) References Cited

U.S. PATENT DOCUMENTS

| | | |
|---|---|---|
| 9,825,032 B1 | 11/2017 | Bentley et al. |
| 9,954,529 B2 | 4/2018 | Anderson et al. |
| 10,037,397 B2 | 7/2018 | Moroz et al. |
| 2017/0373071 A1 | 12/2017 | Lim et al. |
| 2018/0175024 A1 | 6/2018 | Do et al. |
| 2018/0197788 A1 | 7/2018 | Anderson et al. |
| 2018/0219011 A1 | 8/2018 | Cheng et al. |
| 2018/0254287 A1* | 9/2018 | Seo ........................ G06F 30/394 |
| 2018/0269329 A1* | 9/2018 | Balakrishnan ...... H01L 29/7889 |
| 2019/0319116 A1* | 10/2019 | Lee .................. H01L 21/30604 |
| 2019/0355717 A1* | 11/2019 | Zhou ................. H01L 21/02164 |

* cited by examiner

*Primary Examiner* — Phuc T Dang
(74) *Attorney, Agent, or Firm* — Myers Bigel, P.A.

(57) ABSTRACT

Integrated circuit devices including standard cells are provided. The standard cells may include a first vertical field effect transistor (VFET) having a first conductivity type, and a second VFET having a second conductivity type. The first VFET may include a first top source/drain region, a first channel region, and a first bottom source/drain region. The second VFET may include a second top source/drain region, a second channel region, and a second bottom source/drain region. The standard cells may also include a conductive line that is electrically connected to the first top source/drain region or the first bottom source/drain region and is electrically connected to the second bottom source/drain region. The standard cell may be configured to output an output signal thereof through the conductive line.

20 Claims, 32 Drawing Sheets

INTEGRATED CIRCUIT DEVICES INCLUDING VERTICAL FIELD-EFFECT TRANSISTORS (VFETS)

CROSS-REFERENCE TO RELATED APPLICATION

This application claims priority to U.S. Provisional Application Ser. No. 62/755,675, entitled VFET CELL DESIGN WITH ASYMMETRIC SOURCE AND DRAIN, filed in the USPTO on Nov. 5, 2018, the disclosure of which is hereby incorporated by reference herein in its entirety.

FIELD

The present disclosure generally relates to the field of electronics and, more particularly, to vertical field-effect transistor (VFET) devices.

BACKGROUND

VFET devices have been researched because of high scalability of VFETs. Further, interconnections between VFETs may be simpler than those between planar transistors.

SUMMARY

According to some embodiments of the present inventive concept, standard cells may include a first vertical field effect transistor (VFET) having a first conductivity type, and a second VFET having a second conductivity type that is different from the first conductivity type. The first VFET may include a first top source/drain region on a substrate, a first channel region between the first top source/drain region and the substrate, and a first bottom source/drain region in the substrate. The second VFET may include a second top source/drain region on the substrate, a second channel region between the second top source/drain region and the substrate, and a second bottom source/drain region in the substrate. The standard cells may also include a conductive line that is electrically connected to the first top source/drain region or the first bottom source/drain region and is electrically connected to the second bottom source/drain region. The standard cell may be configured to output an output signal thereof through the conductive line.

According to some embodiments of the present inventive concept, standard cells may include a substrate including a cell region and a dummy region, a first vertical field effect transistor (VFET) on the cell region of the substrate, and a second VFET on the cell region of the substrate. The first VFET may have a first conductivity type and may include a first top source/drain region, a first channel region between the first top source/drain region and the cell region of the substrate, and a first bottom source/drain region in the cell region of the substrate. The second VFET may have a second conductivity type that is different from the first conductivity type and may include a second top source/drain region, a second channel region between the second top source/drain region and the cell region of the substrate, and a second bottom source/drain region in the cell region of the substrate. The second bottom source/drain region may extend into the dummy region of the substrate and may include a connecting portion in the dummy region of the substrate. The standard cells may also include an output contact on the dummy region of the substrate. The output contact may contact the connecting portion of the second bottom source/drain region.

According to some embodiments of the present inventive concept, integrated circuit devices may include a first standard cell and a second standard cell. The first standard cell may include a first vertical field effect transistor (VFET) having a first conductivity type and a second VFET having a second conductivity type that is different from the first conductivity type. The first VFET may include a first top source/drain region on a substrate, a first channel region between the first top source/drain region and the substrate, and a first bottom source/drain region in the substrate. The second VFET may include a second top source/drain region on the substrate, a second channel region between the second top source/drain region and the substrate, and a second bottom source/drain region in the substrate. The first standard cell may also include a first conductive line electrically connected to both the first top source/drain region and the second top source/drain region. The first standard cell may be configured to output a first output signal thereof through the first conductive line. The second standard cell may include a third VFET having the first conductivity type and a fourth VFET having the second conductivity type. The third VFET may include a third top source/drain region on the substrate, a third channel region between the third top source/drain region and the substrate, and a third bottom source/drain region in the substrate. The fourth VFET may include a fourth top source/drain region on the substrate, a fourth channel region between the fourth top source/drain region and the substrate, and a fourth bottom source/drain region in the substrate. The second standard cell may also include a second conductive line that is electrically connected to the third top source/drain region or the third bottom source/drain region and is electrically connected to the fourth bottom source/drain region. The second standard cell may be configured to output a second output signal thereof through the second conductive line.

DETAILED DESCRIPTION

An integrated circuit device may include multiple standard cells therein, and each of the standard cells may include VFETs. Each of the vertical field effect transistor VFETs includes a bottom source/drain region provided in a substrate and a top source/drain region provided on a channel region, and the bottom source/drain region and the top source/drain region may have different electrical properties (e.g., resistance). For example, the bottom source/drain region may have a resistance higher than that of the top source/drain region. Accordingly, performance of the standard cells may vary depending on which source/drain region among the bottom source/drain region and the top source/drain region is connected to an output node of the standard cells.

In some embodiments of the present inventive concept, an integrated circuit device may include two standard cells that are the same kind such that each of the two standard cells is, for example, an inverter or a 2-input NAND gate. The standard cells may be, for example, an inverter, a 2-input NAND gate, a 3-input NAND gate, a 2-input NOR gate, a 3-input NOR gate, an And-Or inverter (AOI), an Or-And inverter (OAI), an XNOR gate, an XOR gate, a multiplexer (MUX), a latch, or a D-flip-flop. Each of the two standard cells may include a first VFET and a second VFET, which are connected in series. The first VFET has a first conductivity type (e.g., P-type conductivity) and the second VFET has a second conductivity type (e.g., N-type conductivity). A first standard cell of the two standard cells may include a conductive line through which an output signal of the first standard cell is output, and the conductive line may be electrically connected to top source/drain regions of the first and second VFETs of the first standard cell. A second standard cell of the two standard cells may also include a conductive line through which an output signal of the second standard cell is output, and the conductive line may be electrically connected to a bottom source/drain region of the second VFET of the second standard cell.

Figure 1:
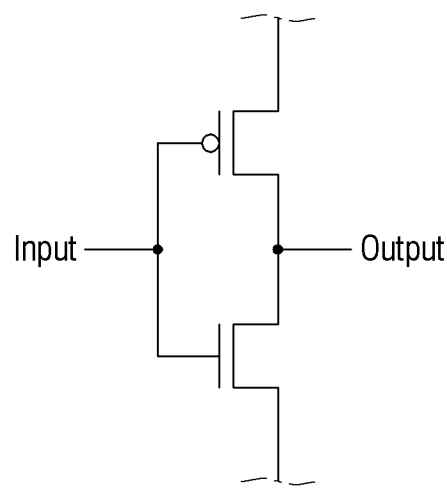
FIG. 1 is a circuit diagram of a portion of a standard cell, according to some embodiments of the present inventive concept.
Figure 2A:
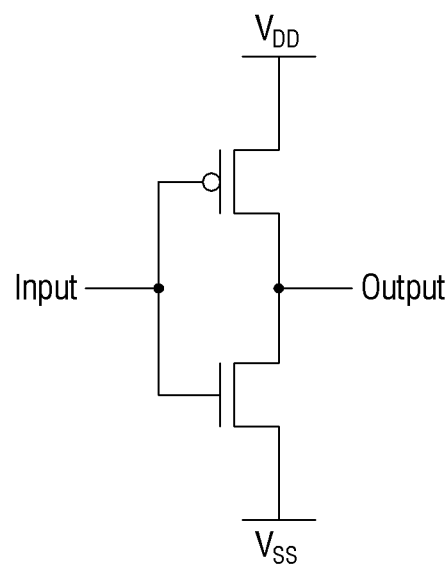
FIGS. 2A and 2B are circuit diagrams of an inverter.
Figure 2B:
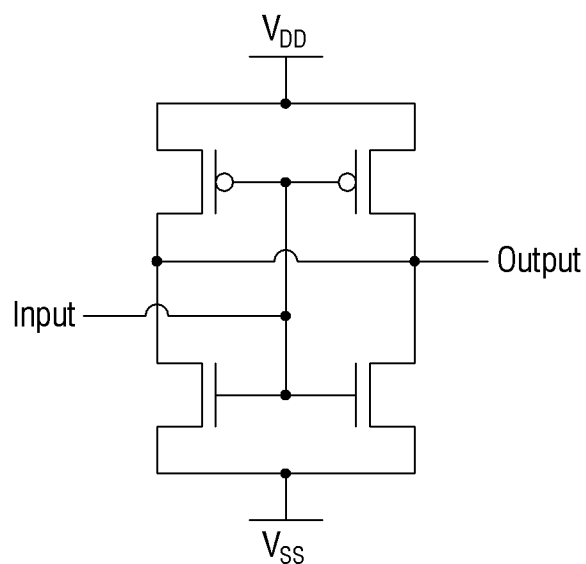

FIG. 1 is a circuit diagram of a portion of a standard cell, which includes one P-type VFET and one N-type VFET, which share a single output and a single input. According to some embodiments of the present inventive concept, the standard cell may be an inverter shown in FIG. 2A. A first power having a first voltage (e.g., a drain voltage $V_{DD}$) may be applied to the P-type VFET, and a second power having a second voltage (e.g., a source voltage $V_{ss}$) may be applied to the N-type VFET. In some embodiments, as shown in FIG. 2B, an inverter may include two P-type VFETs connected in parallel and two N-type VFETs connected in parallel for better performance (e.g., higher current). Although following drawings illustrate inverters including two P-type VFETs and two N-type VFETs as shown in FIG. 2B, it will be understood that the inverters may include a single P-type VFET and a single N-type VFET as shown in FIG. 2A.

Figure 3:
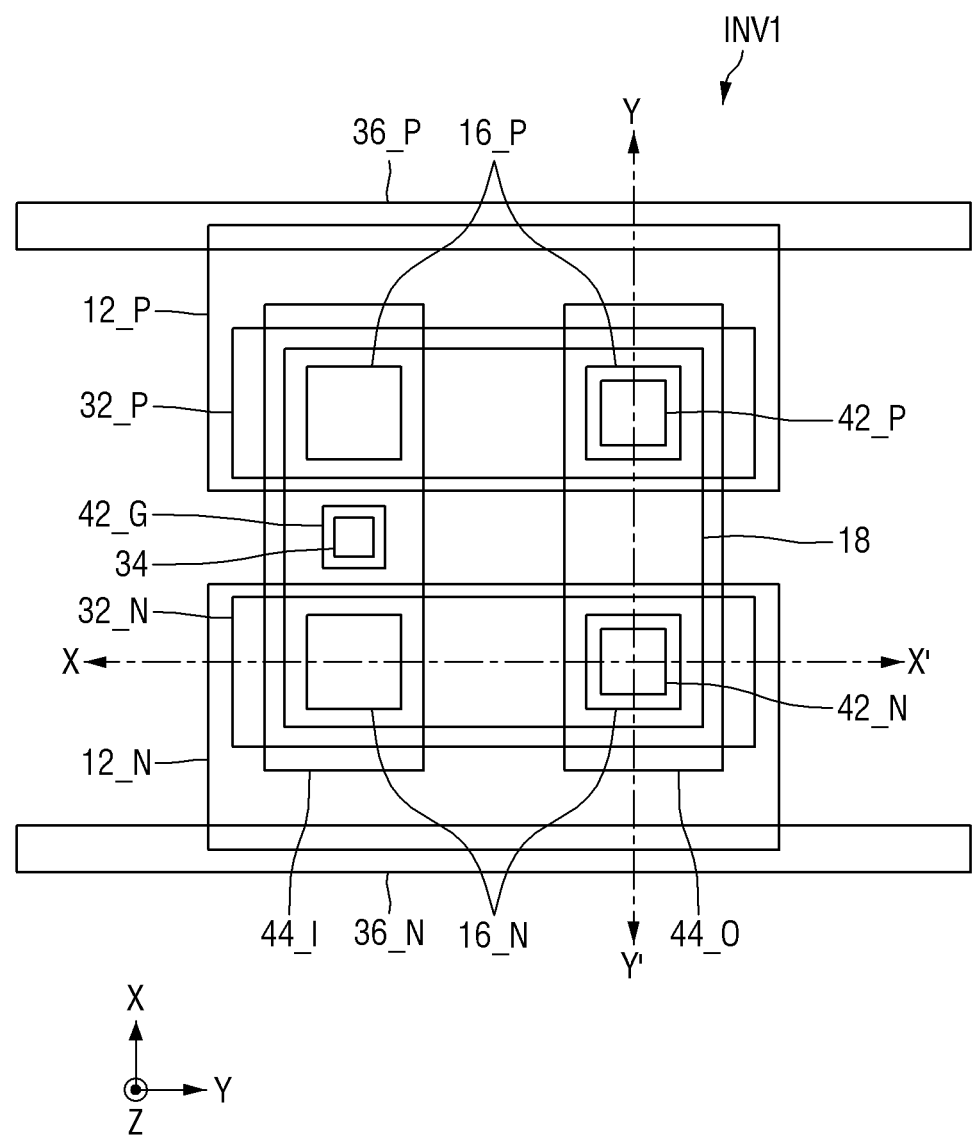
FIG. 3 is a layout of the inverter of FIG. 2B, according to some embodiments of the present inventive concept.
Figure 4A:
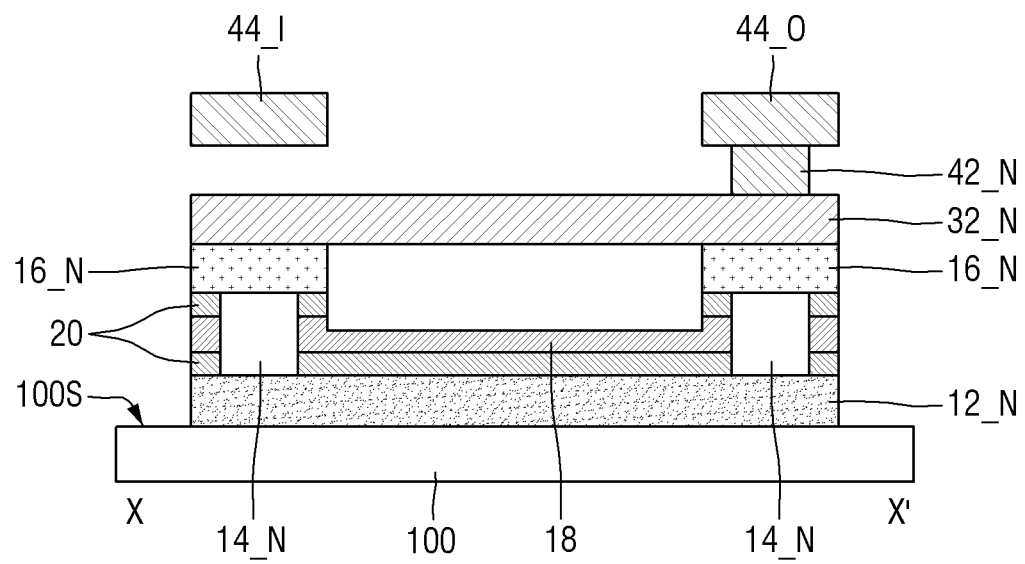
FIGS. 4A and 4B are cross-sectional views taken along the lines X-X' and Y-Y' of FIG. 3, respectively, according to some embodiments of the present inventive concept.
Figure 4B:
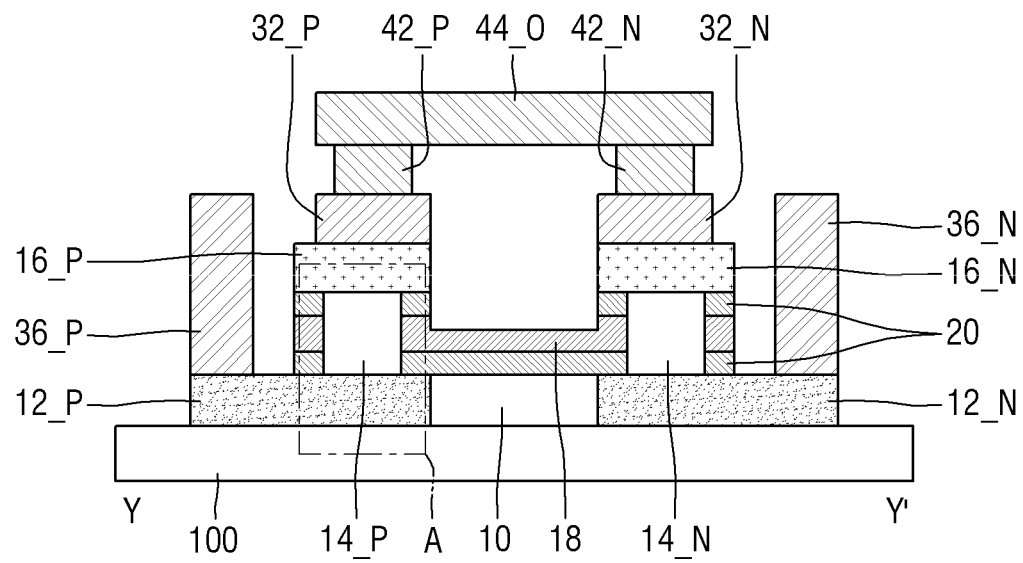

FIG. 3 is a layout of the inverter of FIG. 2B according to some embodiments of the present inventive concept, and FIGS. 4A and 4B are cross-sectional views taken along the lines X-X' and Y-Y' of FIG. 3, respectively, according to some embodiments of the present inventive concept.

Referring to FIGS. 3, 4A and 4B, an inverter INV 1 may include two P-type VFETs connected in parallel and two N-type VFETs connected in parallel. The two P-type VFETs and the two N-type VFET may be spaced apart from each other in a first horizontal direction X that may be parallel to a surface 100S of a substrate 100. The two P-type VFETs may be spaced apart from each other in a second horizontal direction Y that may be parallel to the surface 100S of the substrate 100 and may be perpendicular to the first horizontal direction X. Each of the two P-type VFETs may include a first top source/drain region 16_P on the substrate 100, a first channel region 14_P between the first top source/drain region 16_P and the substrate 100, and a first bottom source/drain region 12_P in the substrate 100. The first top source/drain region 16P and the first bottom source/drain region 12_P may be spaced apart from each other in a vertical direction Z that may be perpendicular to both the first horizontal direction X and the second horizontal direction Y. Accordingly, a current may flow in the vertical direction Z between the first top source/drain region 16_P and the first bottom source/drain region 12_P.

The two N-type VFETs may be spaced apart from each other in the second horizontal direction Y. Each of the two N-type VFETs may include a second top source/drain region 16_N on the substrate 100, a second channel region 14_N between the second top source/drain region 16_N and the substrate 100, and a second bottom source/drain region 12_N in the substrate 100. The second top source/drain region 16_N and the second bottom source/drain region 12_N may be spaced apart from each other in the vertical direction Z. Accordingly, a current may flow in the vertical direction Z between the second top source/drain region 16_N and the second bottom source/drain region 12_N.

The inverter INV 1 may include a common gate layer 18. A first portion of the common gate layer 18 may be a gate electrode of each of the P-type VFETs and a second portion of the common gate layer 18 may be a gate electrode of each of the N-type VFETs. As the P-type VFETs and the N-type VFETs share the common gate layer 18, the same input may be applied to the P-type VFETs and the N-type VFETs as a gate input. Spacers 20 may be provided to electrically isolate the common gate layer 18 from the first and second bottom source/drain regions 12_P and 12_N and from the first and second top source/drain regions 16_P and 16_N.

The first and second bottom source/drain regions 12_P and 12_N may be electrically isolated from each other by an isolation layer 10 (e.g., a shallow trench isolation layer) therebetween. In some embodiments, each of the first and second bottom source/drain regions 12_P and 12_N may extend longitudinally in the second horizontal direction Y, and the isolation layer 10 may also extend longitudinally in the second horizontal direction Y. The two P-type VFETs may share the first bottom source/drain region 12_P, and the two N-type VFETs may share the second bottom source/drain region 12_N.

A first top contact 32_P may be on the two P-type VFETs and may contact the two first top source/drain regions 16_P. The two first top source/drain regions 16_P may be electrically connected to each other through the first top contact 32_P. A second top contact 32_N may be on the two N-type VFETs and may contact the two second top source/drain regions 16_N. The two second top source/drain regions 16_N may be electrically connected to each other through the second top contact 32_N. In some embodiments, each of the first top contact 32_P and the second top contact 32_N may extend longitudinally in the second horizontal direction Y. In some embodiments, each of the first top contact 32_P and the second top contact 32_N may include metal, for example, cobalt (Co), tungsten (W), and/or copper (Cu).

The inverter INV 1 may include a first via contact 42_P contacting the first top contact 32_P, a second via contact 42_N contacting the second top contact 32_N, and a first conductive line 44_O on the first via contact 42_P and the second via contact 42_N. The first conductive line 44_O may contact both the first via contact 42_P and the second via contact 42_N, as shown in FIG. 4B, and the first via contact 42_P and the second via contact 42_N may be electrically connected to each other through the first conductive line 44_O. The inverter INV 1 may output its output signal through the first conductive line 44_O that is electrically connected to both the two first top source/drain regions 16_P and the two second top source/drain regions 16_N. Accordingly, the first conductive line 44_O may be referred to as an output conductive line.

The inverter INV 1 may include a gate contact 34 contacting the common gate layer 18 and a gate via contact 42_G on the gate contact 34. The gate contact 34 and the gate via contact 42_G may be sequentially stacked on the substrate 100 in the vertical direction Z. A second conductive line 44_I may be on the gate via contact 42_G and may be electrically connected to the gate via contact 42_G. An input signal of the inverter INV 1 may be applied to the common gate layer 18 through the second conductive line 44_I. Accordingly, the second conductive line 44_I may be referred to as an input conductive line. The first and second conductive lines 44_O and 44_I may be at an equal level and may include metal, for example, Co, W, and/or Cu. In some embodiments, the first and second conductive lines 44_O and 44_I may be metal lines that are closest to the substrate 100 in the vertical direction Z and may be referred to as first metal lines used for routing.

Still referring to FIGS. 3 and 4B, the inverter INV 1 may include a first bottom contact 36_P and a second bottom contact 36_N, which are spaced apart from each other in the first horizontal direction X. Each of the first bottom contact 36_P and the second bottom contact 36_N may extend longitudinally in the second horizontal direction Y. The first bottom contact 36_P may contact the first bottom source/drain region 12_P, and a first power having a first voltage (e.g., a drain voltage $V_{DD}$) may be applied to the first bottom source/drain region 12_P through the first bottom contact 36_P. The second bottom contact 36_N may contact the second bottom source/drain region 12_N, and a second power having a second voltage (e.g., a source voltage $V_{SS}$) may be applied to the second bottom source/drain region 12_N through the second bottom contact 36_N. For example, the first and second bottom contacts 36_P and 36_N may include metal, for example, Co, W, and/or Cu.

Figure 5A:
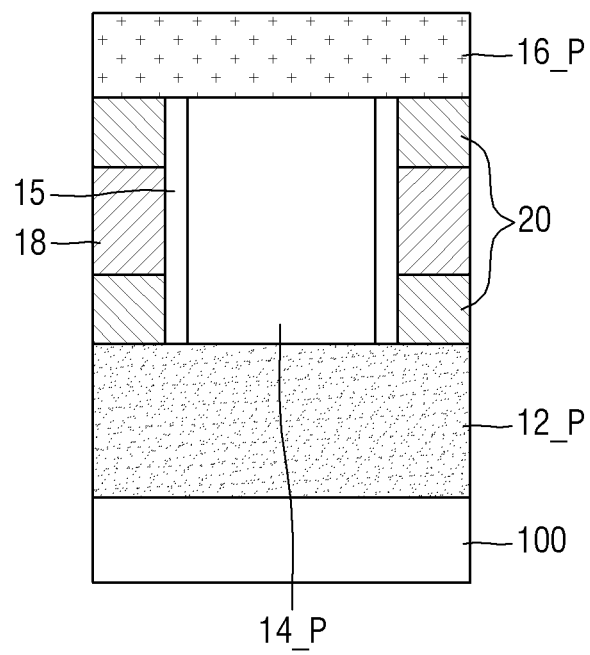
FIGS. 5A and 5B are enlarged views of the region A of FIG. 4B, according to some embodiments of the present inventive concept.
Figure 5B:
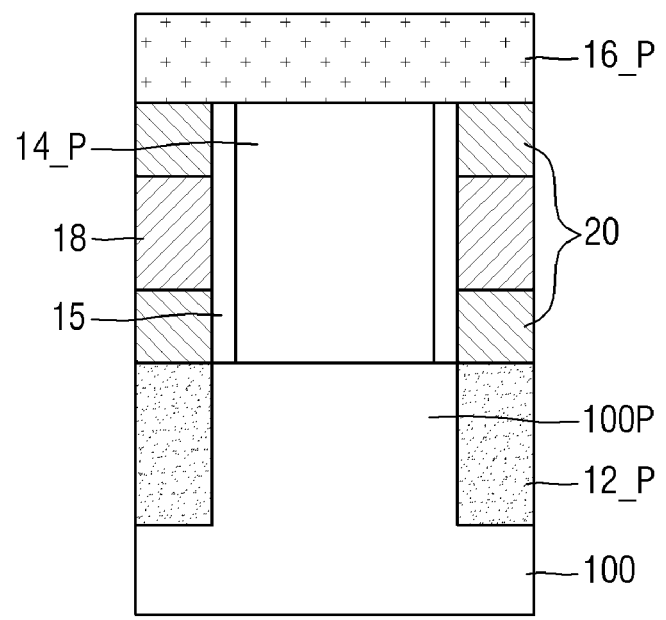

FIGS. 5A and 5B are enlarged views of the region A of FIG. 4B, according to some embodiments of the present inventive concept. Referring to FIGS. 5A and 5B, a gate insulator 15 may be disposed between the first channel region 14_P and the common gate layer 18 to electrically isolate the first channel region 14_P and the common gate layer 18. Although FIGS. FIGS. 5A and 5B shows that the gate insulator 15 is also between the spacer 20 and the first channel region 14_P, it will be understood that the gate insulator 15 can be omitted between the spacer 20 and the first channel region 14_P, and the spacer 20 may contact the first channel region 14_P. In some embodiments, a lower surface of the first channel region 14_P may vertically overlap the first bottom source/drain region 12_P, as illustrated in FIG. 5A. In some embodiments, the lower surface of the first channel region 14_P may be connected to the substrate 100 through a protruding portion 100P of the substrate 100, and the first bottom source/drain region 12_P may be on a side of the protruding portion 100P of the substrate 100, as illustrated in FIG. 5B. Although only the P-type VFET is illustrated in FIGS. 5A and 5B, it will be understood that all VFETs discussed herein, including the N-type VFETs in FIGS. 4A and 4B, can have a structure the same as or similar to the P-type VFET shown in FIGS. 5A and 5B.

In some embodiments, an inverter may output its output signal through a conductive line (i.e., an output conductive line) electrically connected to at least one of bottom source/ drain regions of a P-type VFET and an N-type VFET. The at least one of bottom source/drain regions of the P-type VFET and the N-type VFET may include a portion extending into a dummy region on which no VFET is formed and the portion may be electrically connected to the output conductive line.

Figure 6:
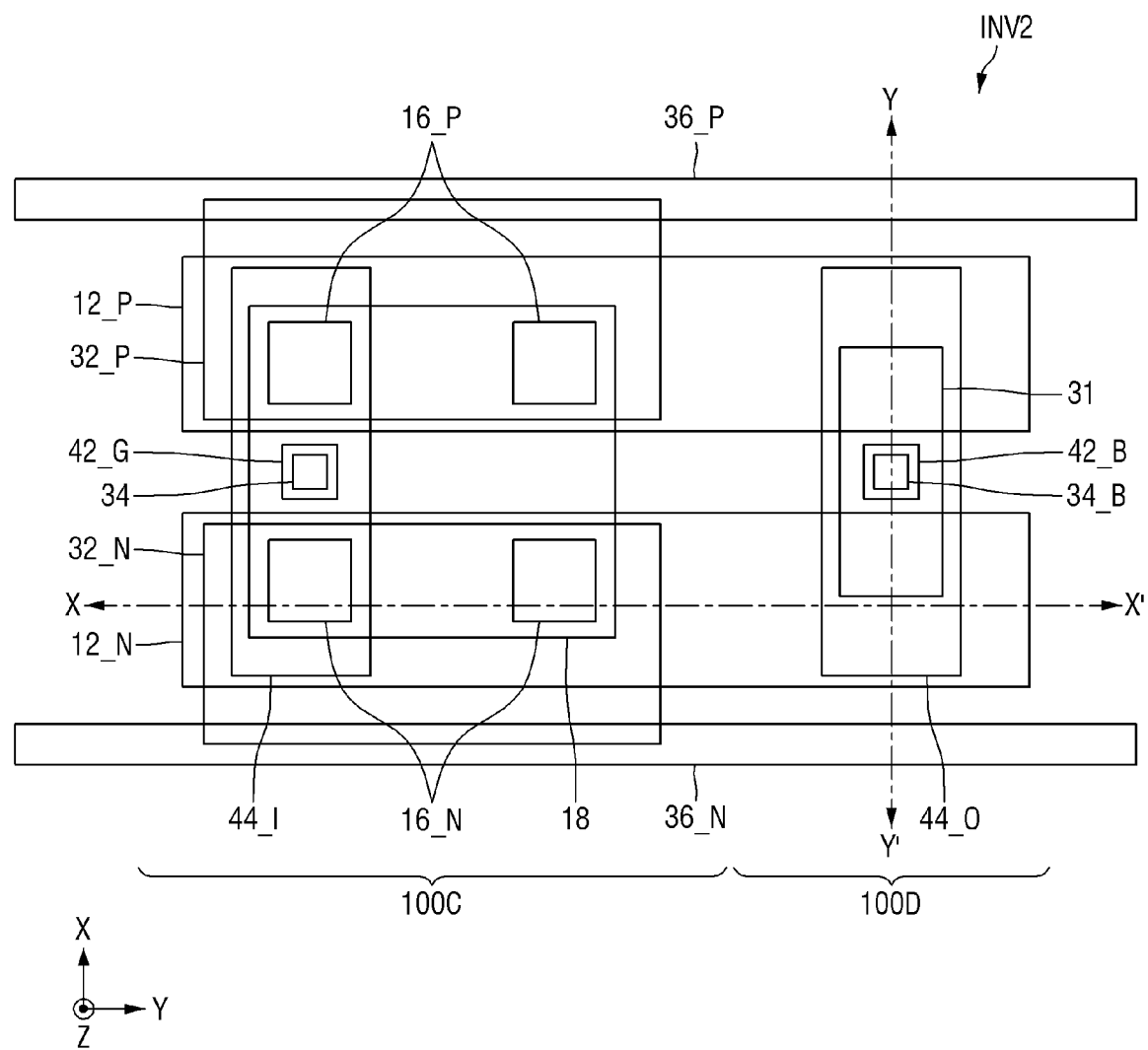
FIG. 6 is a layout of the inverter of FIG. 2B according to some embodiments of the present inventive concept.
Figure 7A:
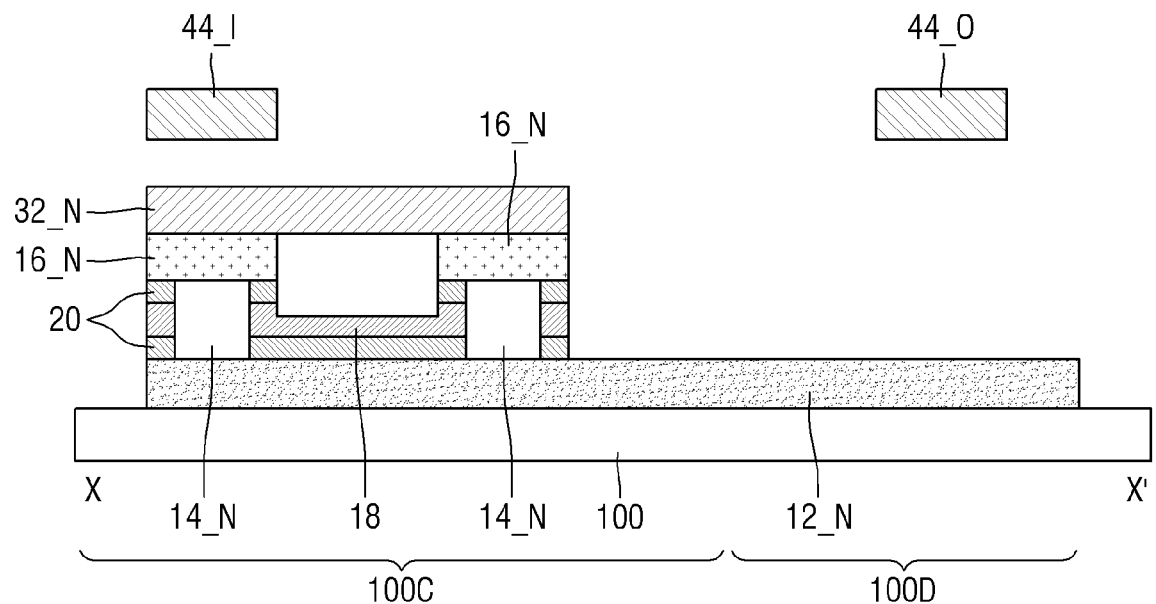
FIGS. 7A and 7B are cross-sectional views taken along the lines X-X' and Y-Y' of FIG. 6, respectively, according to some embodiments of the present inventive concept.
Figure 7B:
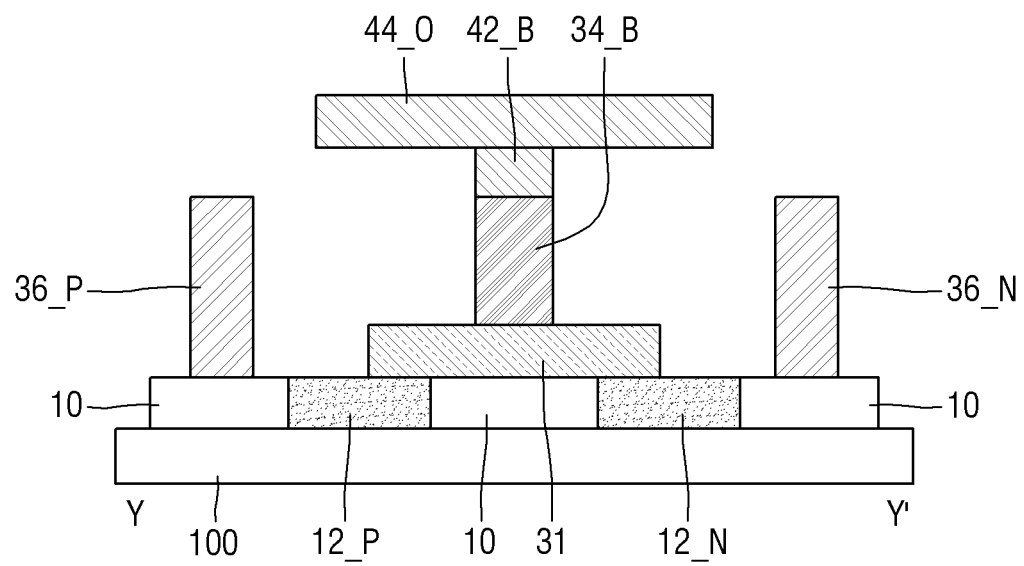

FIG. 6 is a layout of the inverter of FIG. 2B according to some embodiments of the present inventive concept, and FIGS. 7A and 7B are cross-sectional views taken along the lines X-X' and Y-Y' of FIG. 6, respectively, according to some embodiments of the present inventive concept.

Referring to FIGS. 6, 7A, and 7B, the substrate 100 may include a cell region 100C and a dummy region 100D that does not vertically overlap with the cell region 100C. The P-type VFETs and the N-type VFETs may be on the cell region 100C and no VFET may be provided on the dummy region 100D. The first bottom source/drain region 12_P may extend into the dummy region 100D, so that a portion of the first bottom source/drain region 12_P may be in the dummy region 100D. The second bottom source/drain region 12_N may extend into the dummy region 100D, so that a portion of the second bottom source/drain region 12_N may be in the dummy region 100D. As the portion of the first bottom source/drain region 12_P and the portion of the second bottom source/drain region 12_N in the dummy region 100D are provided for connection between the first and second bottom source/drain regions 12_P and 12_N and the first conductive line 44_O, each of the portion of the first bottom source/drain region 12_P and the portion of the second bottom source/drain region 12_N in the dummy region 100D may be referred to as a connecting portion.

The inverter INV 2 may include a bottom-gate contact 31 on the dummy region 100D. The bottom-gate contact 31 may electrically connect the first bottom source/drain region 12_P and the second bottom source/drain region 12_N. In some embodiments, the bottom-gate contact 31 may contact both the connecting portion of the first bottom source/drain region 12_P and the connecting portion of the second bottom source/drain region 12_N in the dummy region 100D as illustrated in FIG. 7B. The bottom-gate contact 31 may include metal, for example, Co, W, and/or Cu. The bottom-gate contact 31 may be electrically connected to the first conductive line 44_O through an additional gate contact 34_B and a via contact 42_B. The inverter INV 2 may output its output signal through the first conductive line 44_O that is electrically connected to both the first bottom source/drain region 12_P and the second bottom source/drain region 12_N. In some embodiments, the additional gate contact 34_B may have an upper surface facing the via contact 42_B, and the upper surface of the additional gate contact 34_B may be coplanar with an upper surface of the gate contact 34, which faces the overlying gate via contact 42_G.

The first top contact 32_P may extend to the first bottom contact 36_P and may contact the first bottom contact 36_P. The second top contact 32_N may extend to the second bottom contact 36_N and may contact the second bottom contact 36_N. The first top contact 32_P may contact the two first top source/drain regions 16_P and a first power having a first voltage (e.g., a drain voltage $V_{DD}$) may be applied to the two first top source/drain regions 16_P through the first bottom contact 36_P and the first top contact 32_P. The second top contact 32_N may contact the two second top source/drain regions 16_N and a second power having a second voltage (e.g., a source voltage $V_{SS}$) may be applied to the two second top source/drain regions 16_N through the second bottom contact 36_N and the second top contact 32_N.

Figure 8:
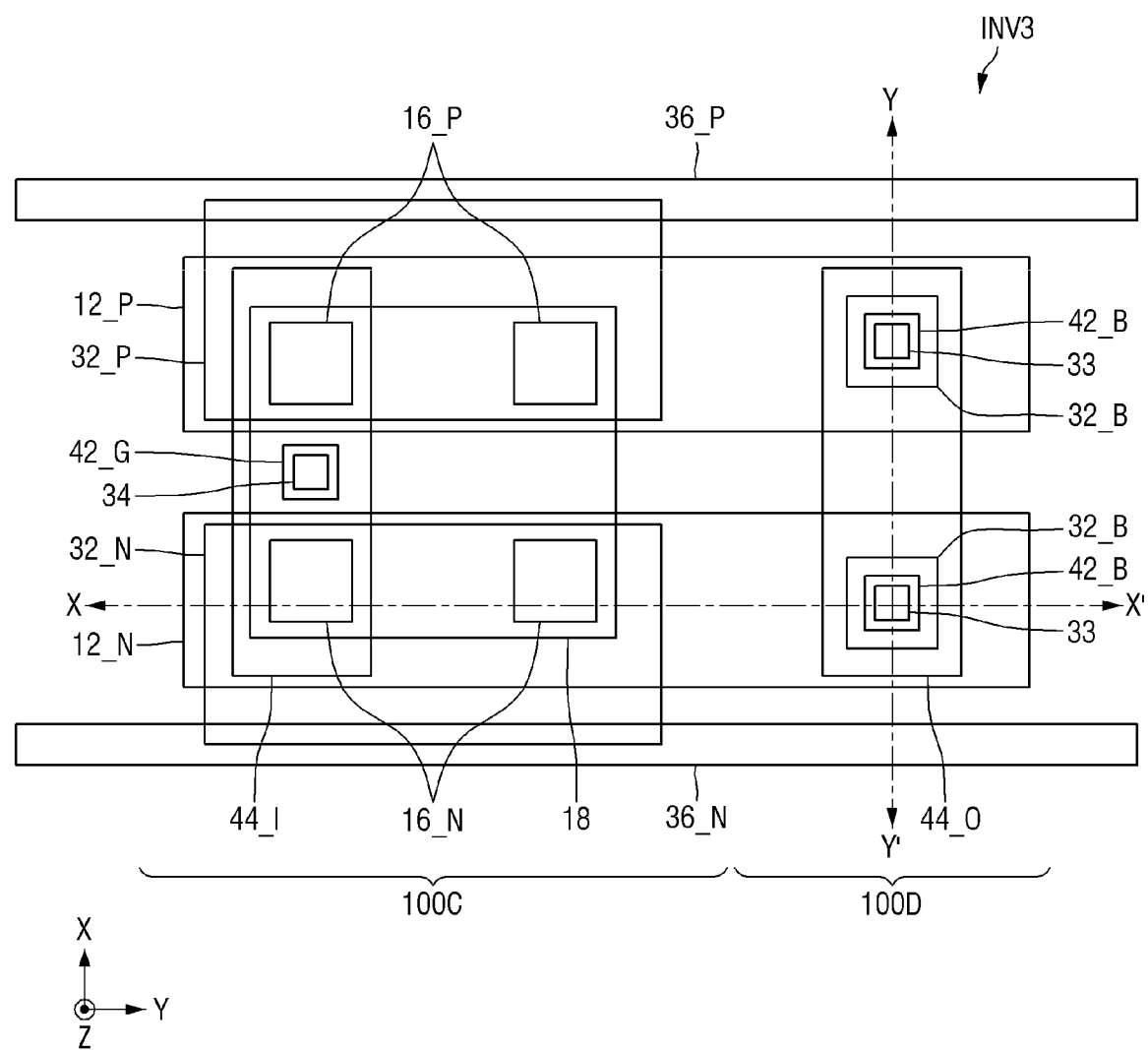
FIG. 8 is a layout of the inverter of FIG. 2B according to some embodiments of the present inventive concept.
Figure 9A:
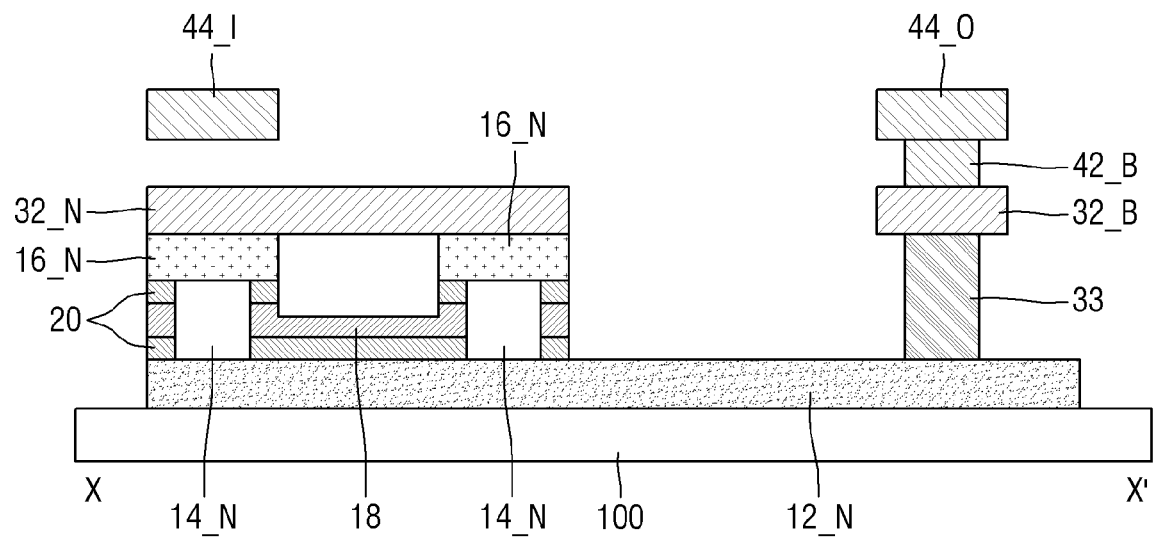
FIGS. 9A and 9B are cross-sectional views taken along the lines X-X' and Y-Y' of FIG. 8, respectively, according to some embodiments of the present inventive concept.
Figure 9B:
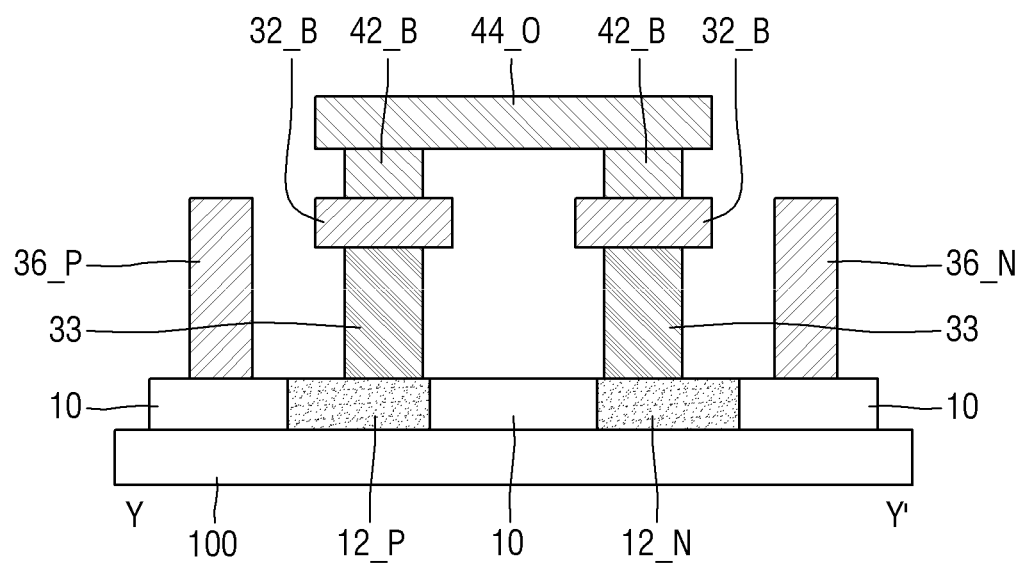

FIG. 8 is a layout of the inverter of FIG. 2B according to some embodiments of the present inventive concept, and FIGS. 9A and 9B are cross-sectional views taken along the lines X-X' and Y-Y' of FIG. 8, respectively, according to some embodiments of the present inventive concept. An inverter INV 3 shown in FIGS. 8, 9A, and 9B is the same as or similar to the inverter INV 2 shown in FIGS. 6, 7A, and 7B, except the way that the first bottom source/drain region 12_P and the second bottom source/drain region 12_N are connected to the first conductive line 44_O.

Referring to FIGS. 8, 9A, and 9B, the inverter INV 3 may include two bottom-top contacts 33, and each of the two bottom-top contacts 33 may be electrically connected to a respective one of the first bottom source/drain region 12_P and the second bottom source/drain region 12_N. In some embodiments, each of the two bottom-top contacts 33 may contact a respective one of the first bottom source/drain region 12_P and the second bottom source/drain region 12_N. Each of the two bottom-top contacts 33 may be electrically connected to the first conductive line 44_O through an additional top contact 32_B and a via contact 42_B. The two bottom-top contacts 33 may include metal, for example, Co, W, and/or Cu. The inverter INV 3 may output its output signal through the first conductive line 44_O that is electrically connected to both the first bottom source/drain region 12_P and the second bottom source/drain region 12_N.

Figure 10:
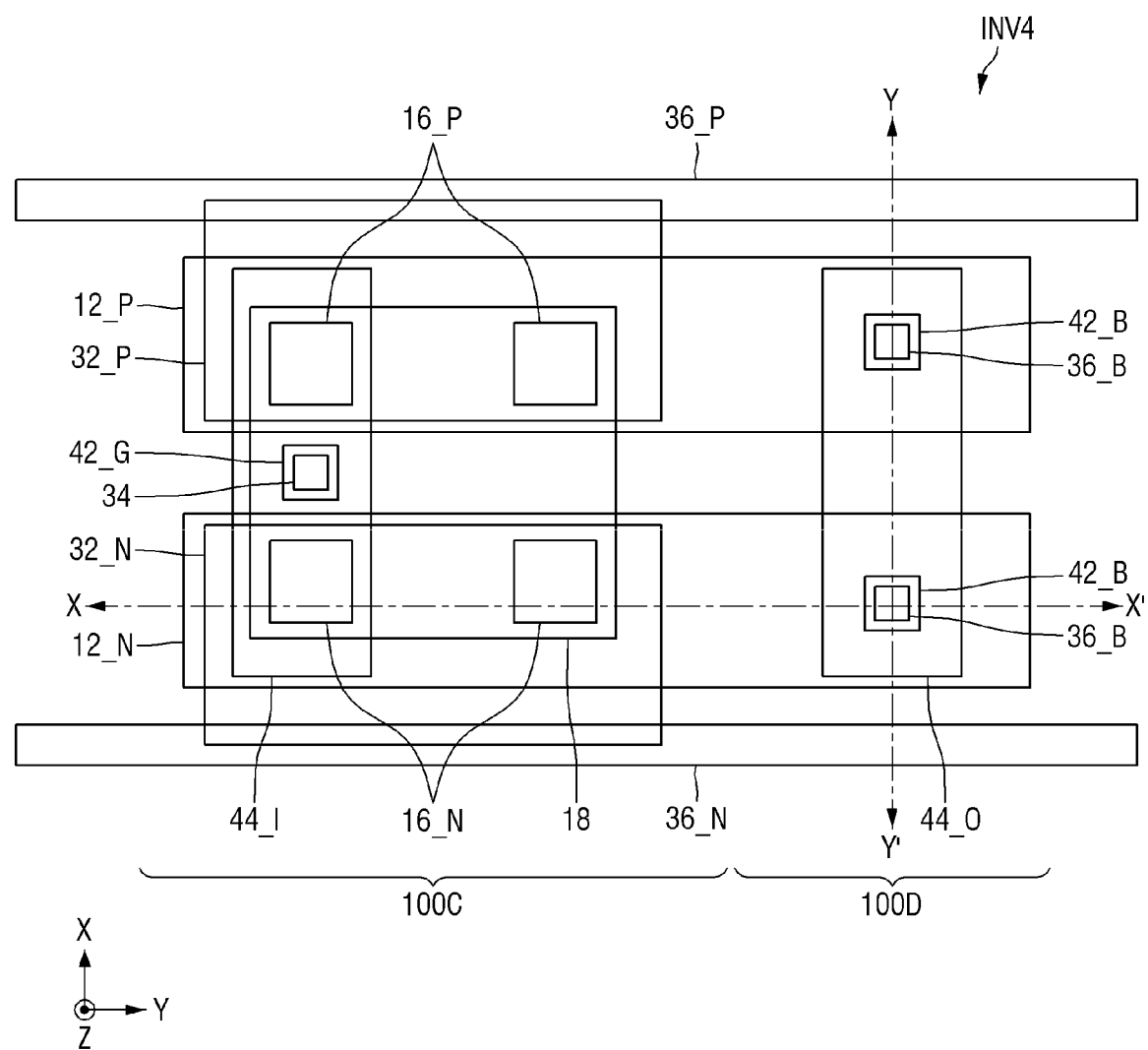
FIG. 10 is a layout of the inverter of FIG. 2B according to some embodiments of the present inventive concept.
Figure 11A:
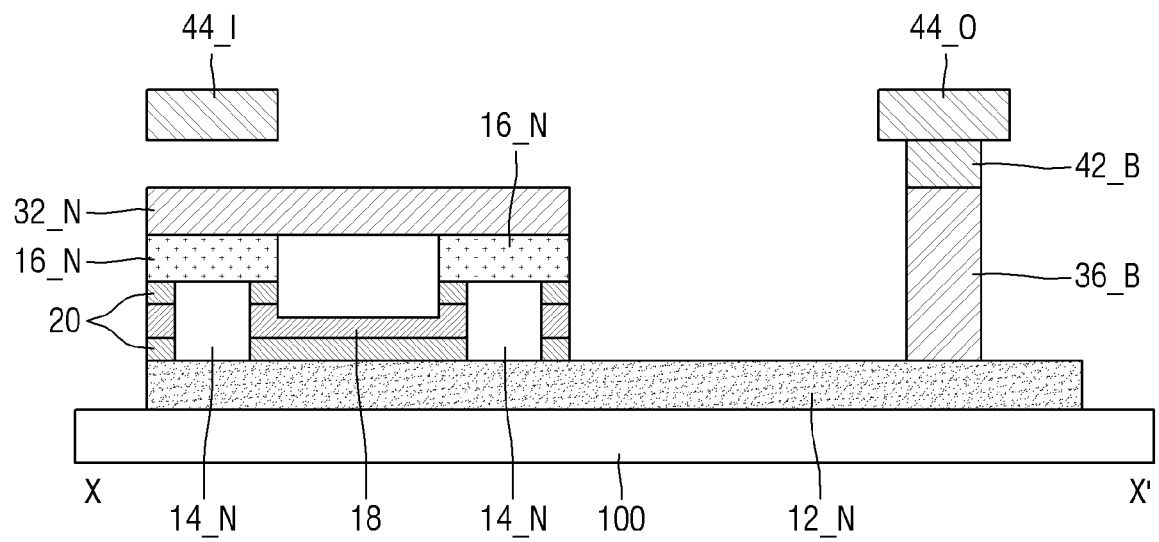
FIGS. 11A and 11B are cross-sectional views taken along the lines X-X' and Y-Y' of FIG. 10, respectively, according to some embodiments of the present inventive concept.
Figure 11B:
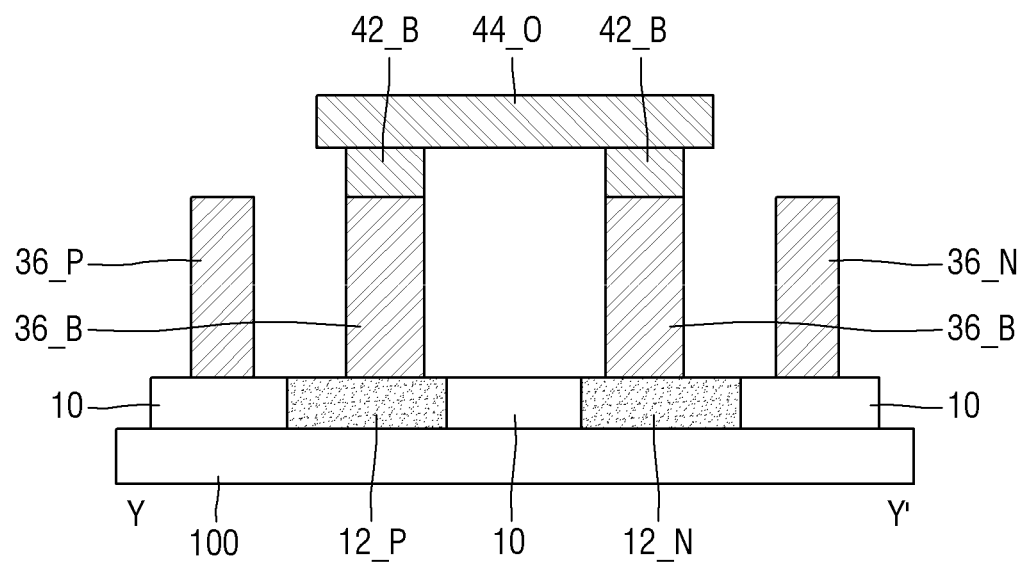

FIG. 10 is a layout of the inverter of FIG. 2B according to some embodiments of the present inventive concept, and FIGS. 11A and 11B are cross-sectional views taken along the lines X-X' and Y-Y' of FIG. 10, respectively, according to some embodiments of the present inventive concept. An inverter INV 4 shown in FIGS. 10, 11A, and 11B, is the same as or similar to the inverter INV 2 shown in FIGS. 6, 7A, and 7B except the way that the first bottom source/drain region 12_P and the second bottom source/drain region 12_N are connected to the first conductive line 44_O.

Referring to FIGS. 10, 11A, and 11B, the inverter INV 4 may include two third bottom contacts 36_B. Each of the two third bottom contacts 36_B may be electrically connected to a respective one of the first bottom source/drain region 12_P and the second bottom source/drain region 12_N. In some embodiments, each of the two third bottom contacts 36_B may contact a respective one of the first bottom source/drain region 12_P and the second bottom source/drain region 12_N. Each of the two third bottom contact 36_B may be electrically connected to the first conductive line 44_O through a via contact 42_B. The inverter INV 4 may output its output signal through the first conductive line 44_O that is electrically connected to both the first bottom source/drain region 12_P and the second bottom source/drain region 12_N.

In some embodiments, each of the two third bottom contacts 36_B may have an upper surface facing the via contact 42_B, and the upper surfaces of the two third bottom contacts 36_B may be coplanar with upper surfaces of the first and second bottom contacts 36_P and 36_N, as illustrated in FIG. 11B. In some embodiments, the two third bottom contacts 36_B and the first and second bottom contacts 36_P and 36_N may have an equal length in the vertical direction Z, as illustrated in FIG. 11B. The two third bottom contacts 36_B may be formed of material(s) the same as the first and second bottom contacts 36_P and 36_N and may include metal, for example, Co, W, and/or Cu.

Figure 12:
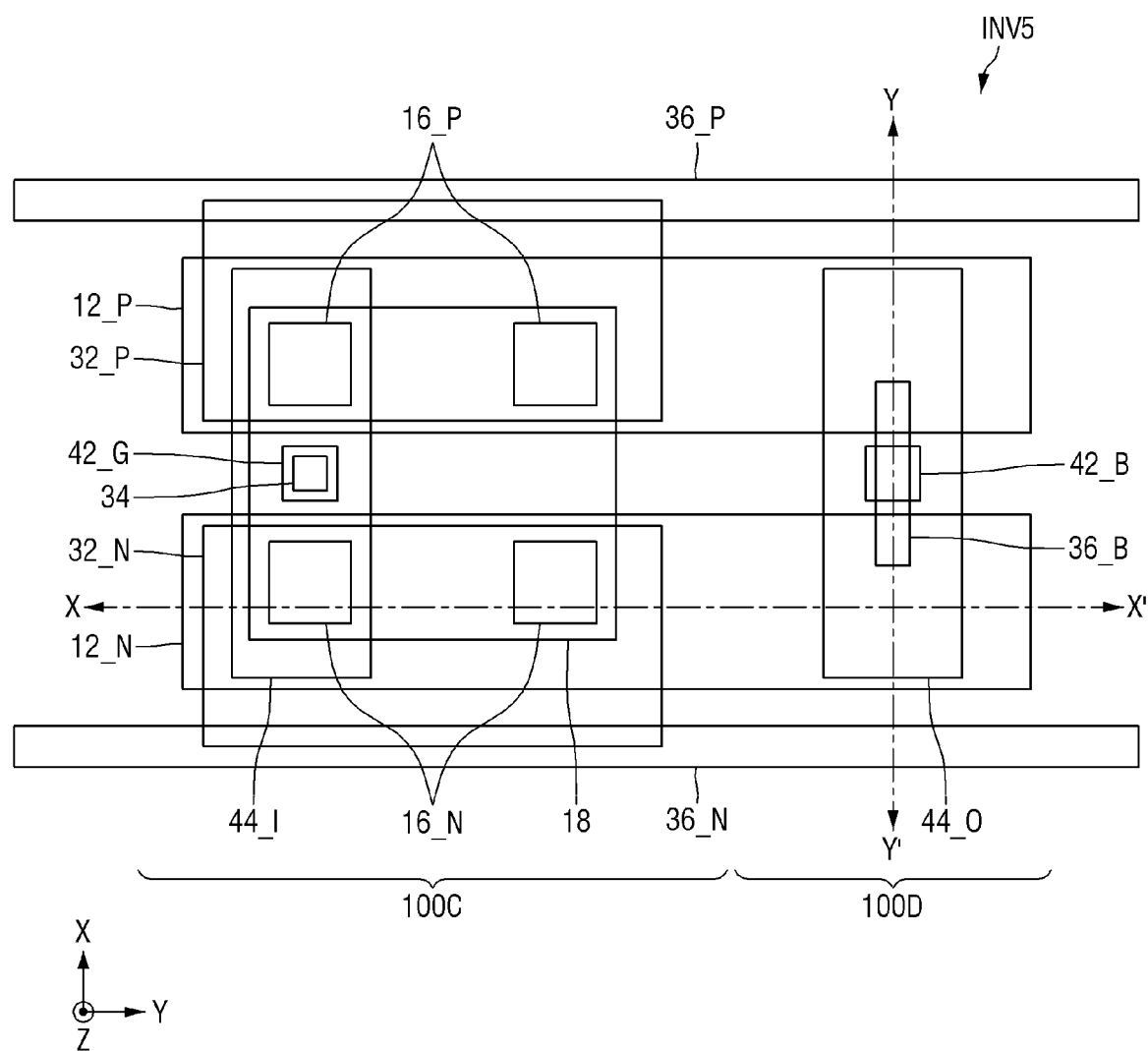
FIG. 12 is a layout of the inverter of FIG. 2B according to some embodiments of the present inventive concept.
Figure 13A:
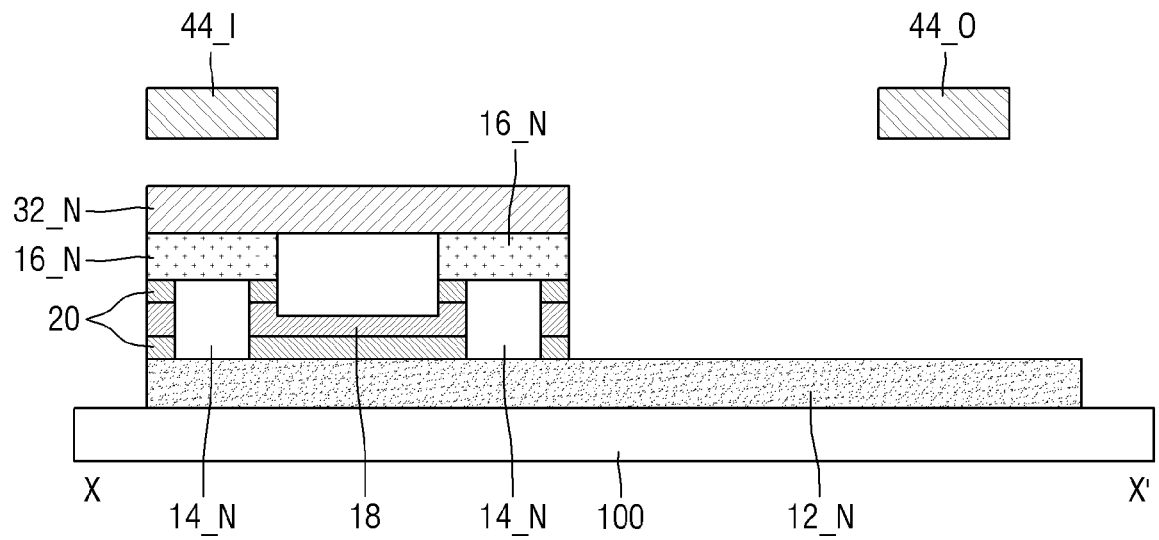
FIGS. 13A and 13B are cross-sectional views taken along the lines X-X' and Y-Y' of FIG. 12, respectively, according to some embodiments of the present inventive concept.
Figure 13B:
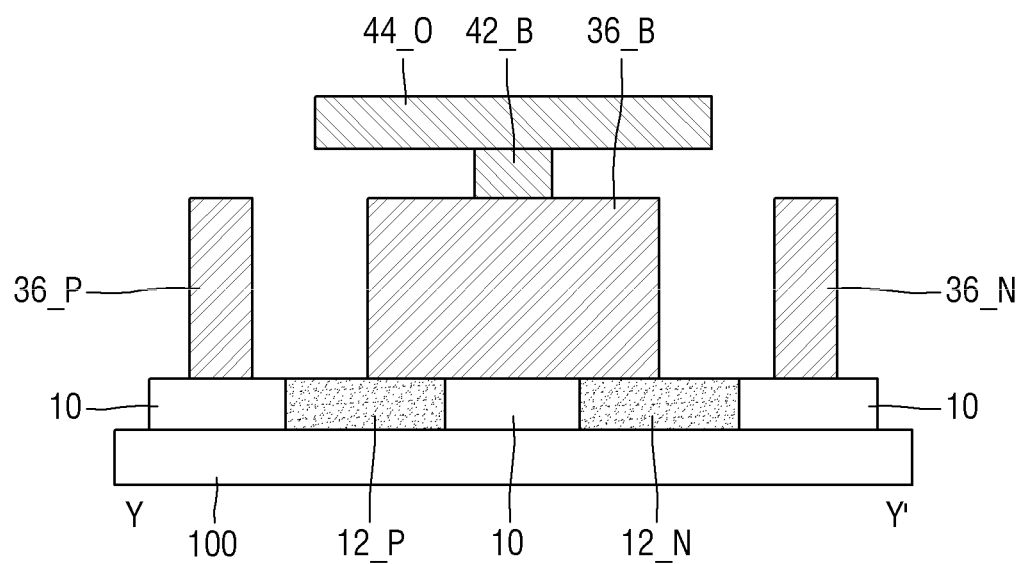

FIG. 12 is a layout of the inverter of FIG. 2B according to some embodiments of the present inventive concept, and FIGS. 13A and 13B are cross-sectional views taken along the lines X-X' and Y-Y' of FIG. 12, respectively, according to some embodiments of the present inventive concept. An inverter INV 5 shown in FIGS. 12, 13A, and 13B is the same as or similar to the inverter INV 4 shown in FIGS. 10, 11A, and 11B except a shape of a third bottom contact 36B.

Referring to FIGS. 12, 13A, and 13B, the inverter INV 5 may include a third bottom contact 36_B that may be electrically connected to both the first bottom source/drain region 12_P and the second bottom source/drain region 12_N. In some embodiments, the third bottom contact 36_B may contact both the first bottom source/drain region 12_P and the second bottom source/drain region 12_N. The third bottom contact 36_B may also contact the isolation layer 10 extending between the first bottom source/drain region 12_P and the second bottom source/drain region 12_N. The third bottom contact 36_B may be electrically connected to the first conductive line 44_O through a via contact 42_B. The inverter INV 5 may output its output signal through the first conductive line 44_O that is electrically connected to both the first bottom source/drain region 12_P and the second bottom source/drain region 12_N.

In some embodiments, the third bottom contact 36_B may have an upper surface facing the via contact 42_B and the upper surface of the third bottom contact 36_B may be coplanar with upper surfaces of the first and second bottom contacts 36_P and 36_N, as illustrated in FIG. 13B. In some embodiments, the third bottom contact 36_B and the first and second bottom contacts 36_P and 36_N may have an equal length in the vertical direction Z, as illustrated in FIG. 13B. The third bottom contact 36_B may be formed of material the same as the first and second bottom contacts 36_P and 36_N and may include metal, for example, Co, W, and/or Cu.

Figure 14:
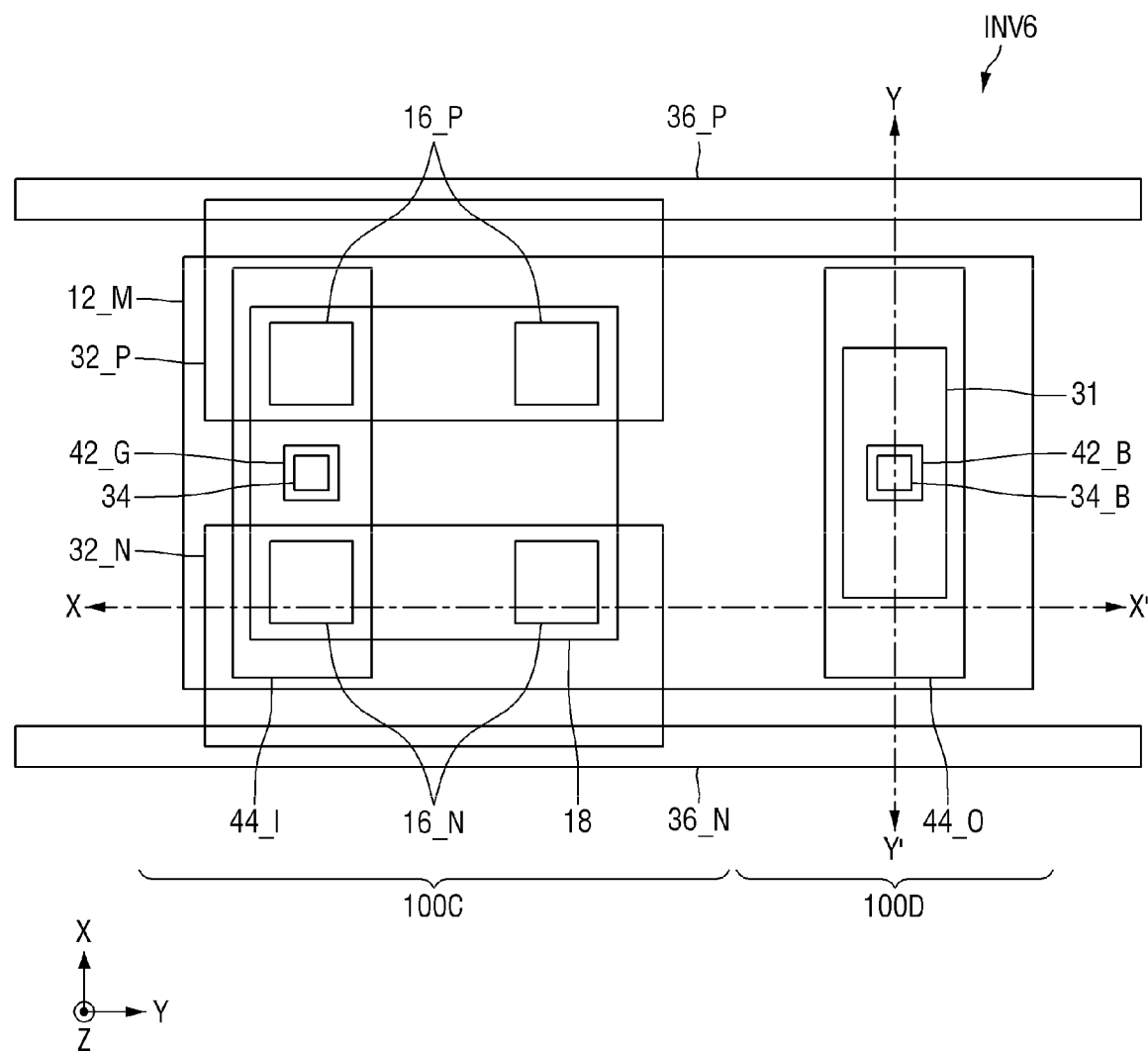
FIG. 14 is a layout of the inverter of FIG. 2B according to some embodiments of the present inventive concept.
Figure 15A:
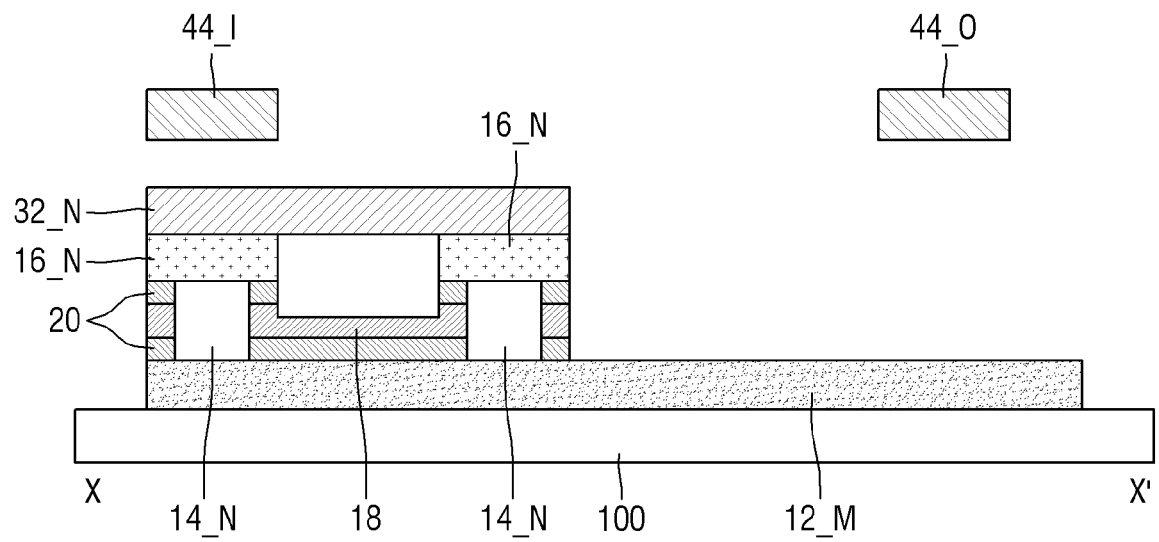
FIGS. 15A and 15B are cross-sectional views taken along the lines X-X' and Y-Y' of FIG. 14, respectively, according to some embodiments of the present inventive concept.
Figure 15B:
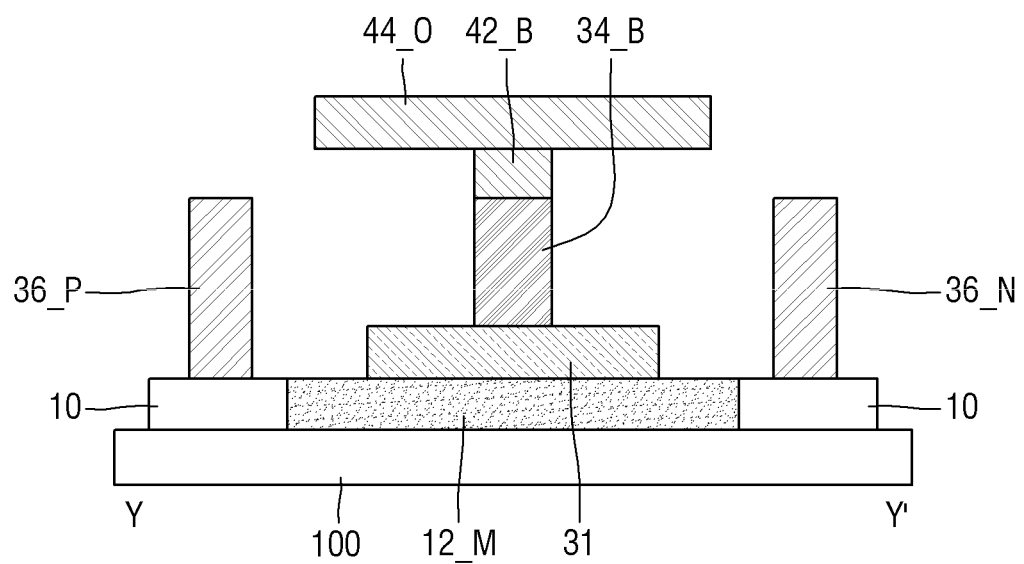

FIG. 14 is a layout of the inverter of FIG. 2B according to some embodiments of the present inventive concept, and FIGS. 15A and 15B are cross-sectional views taken along the lines X-X' and Y-Y' of FIG. 14, respectively, according to some embodiments of the present inventive concept. An inverter INV 6 shown in FIGS. 14, 15A, and 15B is the same as or similar to the inverter INV 2 shown in FIGS. 6, 7A, and 7B except that the inverter INV 6 may include a merged bottom source/drain region 12_M rather than the first bottom source/drain region 12_P and the second bottom source/drain region 12_N.

Referring to FIGS. 14, 15A, and 15B, the inverter INV 6 may include the merged bottom source/drain region 12_M. It will be understood that a first portion of the merged bottom source/drain region 12_M may function as a bottom source/drain region of the two P-type VFETs, and a second portion of the merged bottom source/drain region 12_M may function as a bottom source/drain region of the two N-type VFETs. The merged bottom source/drain region 12_M may be electrically connected to the first conductive line 44_O through an additional gate contact 34_B and a via contact 42_B. The inverter INV 6 may output its output signal through the first conductive line 44_O that is electrically connected to the merged bottom source/drain region 12_M.

Figure 16:
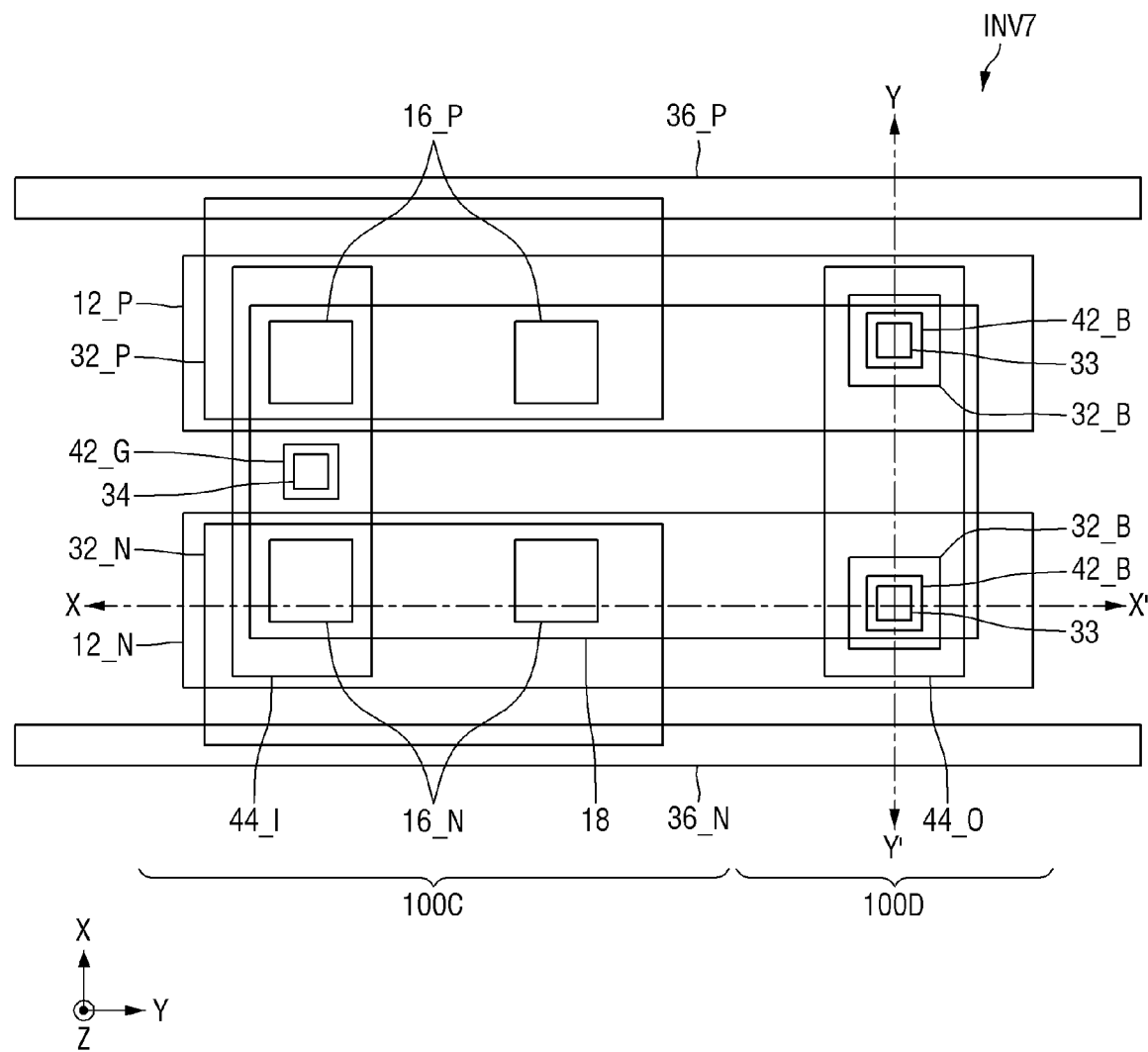
FIG. 16 is a layout of the inverter of FIG. 2B according to some embodiments of the present inventive concept.
Figure 17A:
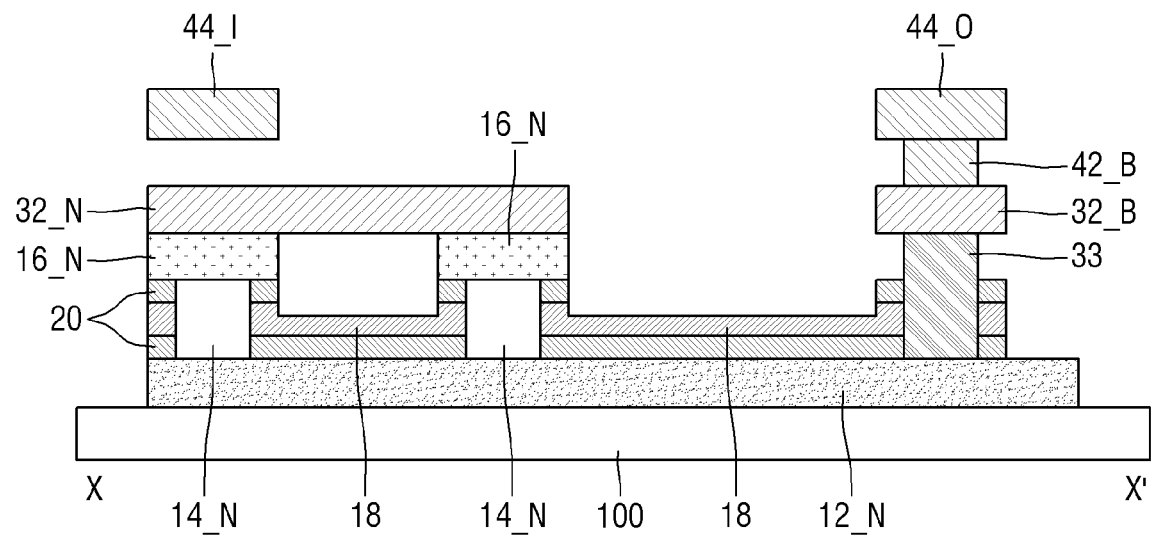
FIGS. 17A and 17B are cross-sectional views taken along the lines X-X' and Y-Y' of FIG. 16, respectively, according to some embodiments of the present inventive concept.
Figure 17B:
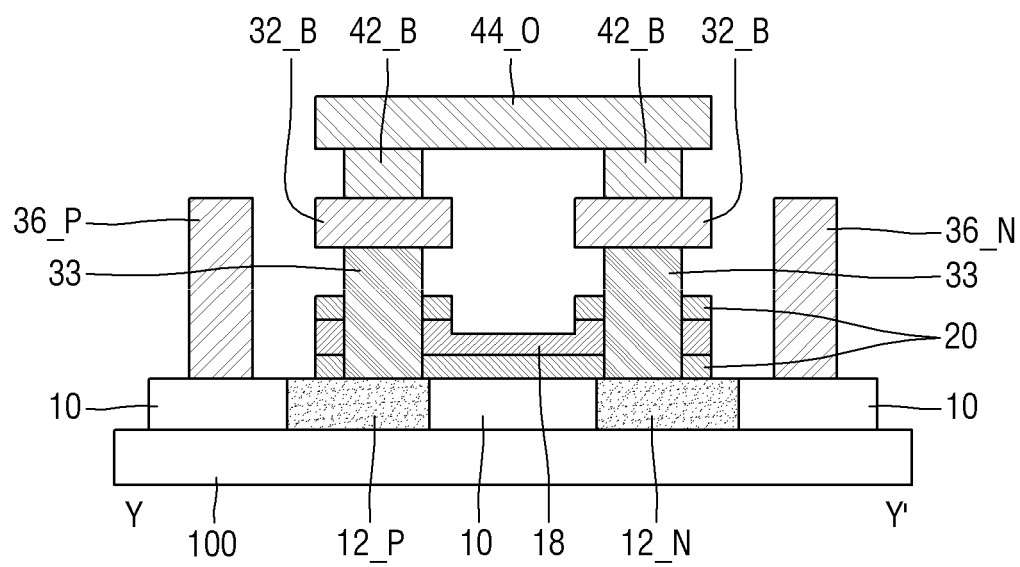

FIG. 16 is a layout of the inverter of FIG. 2B according to some embodiments of the present inventive concept, and FIGS. 17A and 17B are cross-sectional views taken along the lines X-X' and Y-Y' of FIG. 16, respectively, according to some embodiments of the present inventive concept. An inverter INV 7 shown in FIGS. 16, 17A, and 17B is the same as or similar to the inverter INV 3 shown in FIGS. 8, 9A, and 9B, except that the inverter INV 7 may include a portion of the common gate layer 18 on the dummy region 100D of the substrate 100.

Referring to FIGS. 16, 17A, and 17B, the common gate layer 18 may extend onto the dummy region 100D of the substrate 100 and may be on sides of the bottom-top contacts 33, as shown in FIGS. 17A and 17B.

Figure 18:
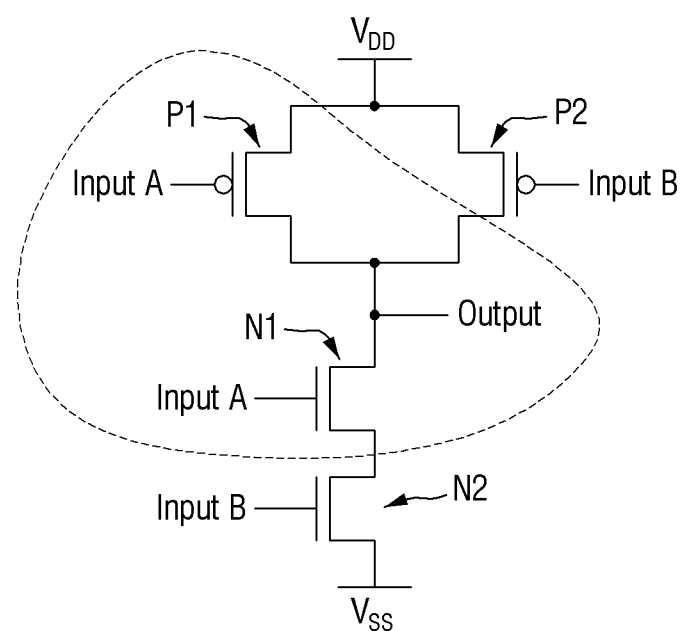
FIG. 18 is a circuit of a 2-input NAND gate, according to some embodiments of the present inventive concept.

According to some embodiments of the present inventive concept, the portion of the standard cell shown in FIG. 1 may be a portion of a 2-input NAND gate. FIG. 18 is a circuit of a 2-input NAND gate, and a portion circled by the dotted line is the same as the circuit shown in FIG. 1. Accordingly, it will be understood that the portion circled by the dotted line in FIG. 18 may have layouts and cross-sectional views the same as or similar to those discussed with reference to FIG. 6 through FIG. 17B.

Referring to FIG. 18, a 2-input NAND gate may include a first P-type VFET P1 and a first N-type VFET N1, which may share a first input (e.g., Input A) and an output (e.g., Output). The 2-input NAND gate may also include a second P-type VFET P2 and a second N-type VFET N2, which share a second input (e.g., Input B).

Figure 19:
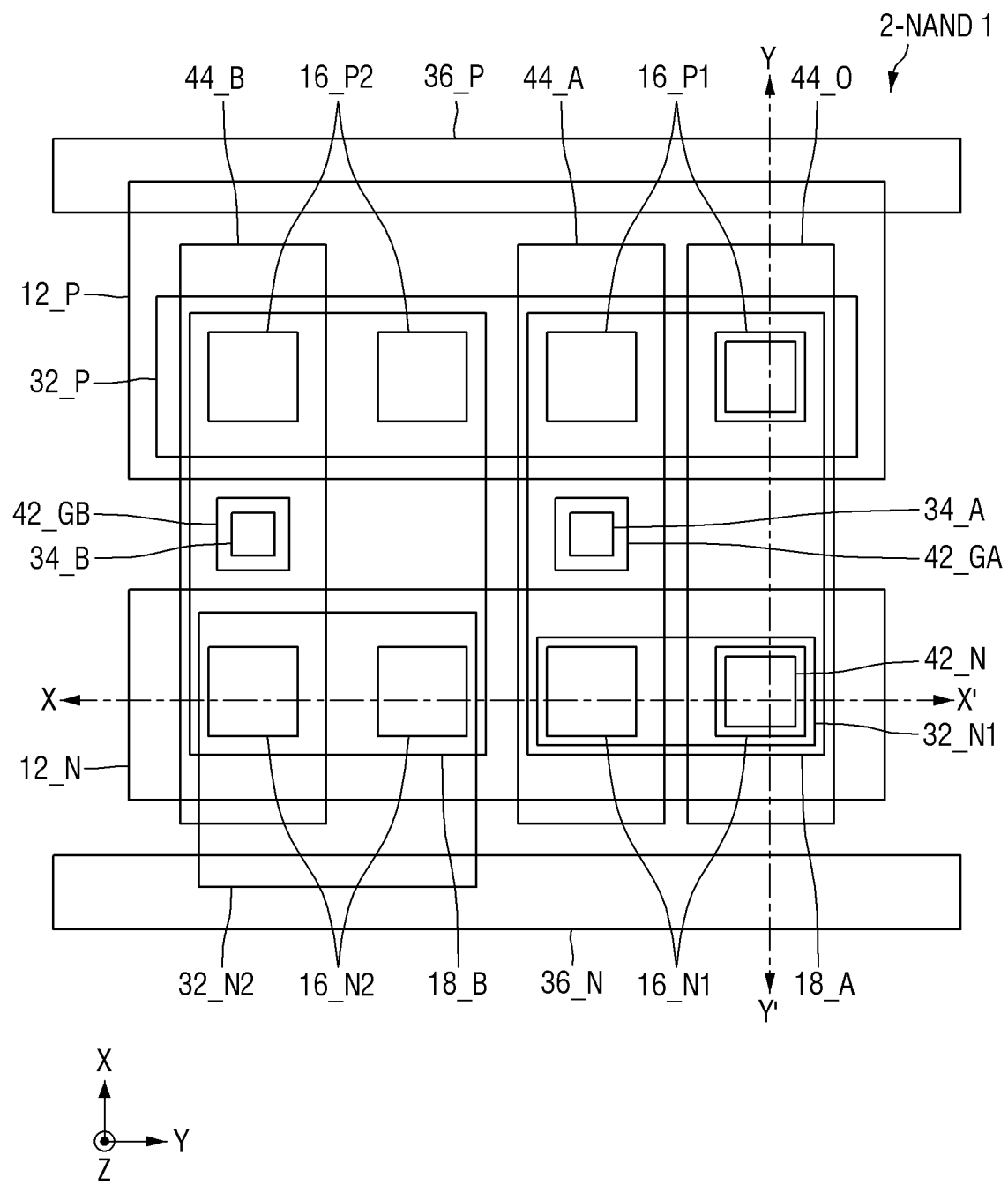
FIG. 19 is a layout of the 2-input NAND gate of FIG. 18 according to some embodiments of the present inventive concept.
Figure 20A:
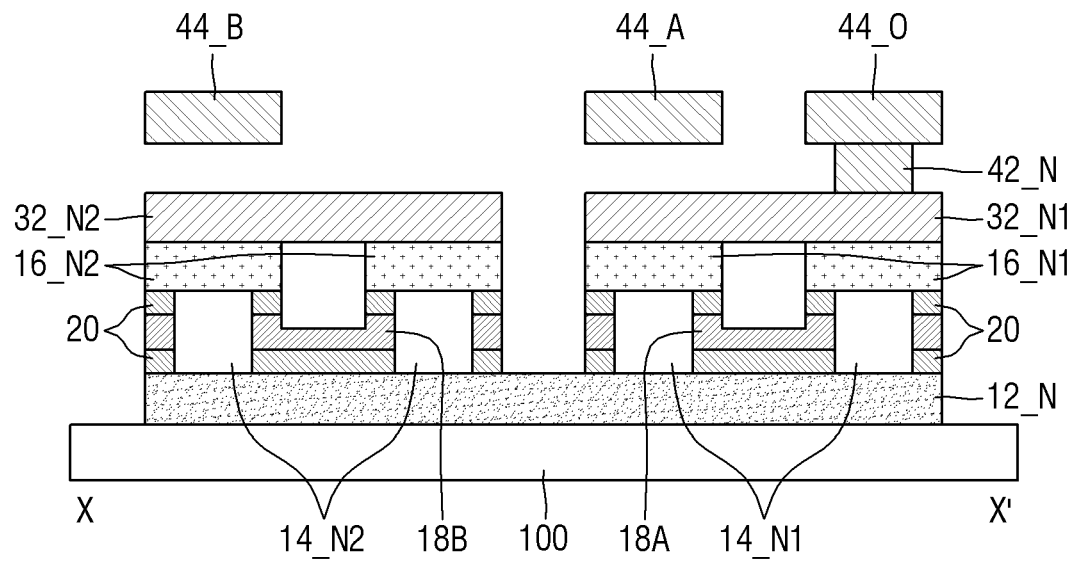
FIGS. 20A and 20B are cross-sectional views taken along the lines X-X' and Y-Y' of FIG. 19, respectively, according to some embodiments of the present inventive concept.
Figure 20B:
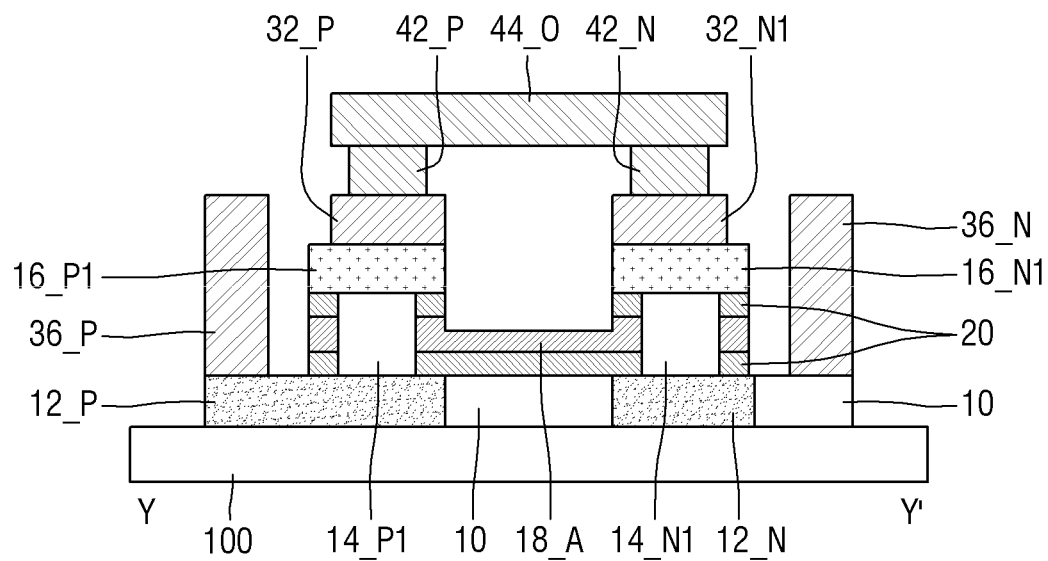

FIG. 19 is a layout of the 2-input NAND gate of FIG. 18 according to some embodiments of the present inventive concept, and FIGS. 20A and 20B are cross-sectional views taken along the lines X-X' and Y-Y' of FIG. 19, respectively, according to some embodiments of the present inventive concept. In some embodiments, each of the first P-type VFET P1, the first N-type VFET N1, the second P-type VFET P2, and the second N-type VFET N2 may include two VFETs connected in parallel for better performance (e.g., higher current) as shown in FIG. 19. Alternatively, each of the first P-type VFET P1, the first N-type VFET N1, the second P-type VFET P2, and the second N-type VFET N2 may include a single transistor.

Referring to FIGS. 19, 20A, and 20B, the first P-type VFET P1 may include two first P-type VFETs P1. Each of the two first P-type VFETs P1 may include a first bottom source/drain region 12_P, a first channel region 14_P1, and a first top source/drain region 16_P1. The first N-type VFET N1 may include two first N-type VFETs N1. Each of the two first N-type VFETs N1 may include a second bottom source/drain region 12_N, a second channel region 14_N1, and a second top source/drain region 16_N1. The second P-type VFET P2 may include two second P-type VFETs P2. Each of the two second P-type VFETs P2 may include the first bottom source/drain region 12_P, a third channel region (not shown), and a third top source/drain region 16_P2. The first bottom source/drain region 12_P may be shared by the two first P-type VFETs P1 and the two second P-type VFETs P2. The second N-type VFET N2 may include two second N-type VFETs N2. Each of the two second N-type VFETs N2 may include the second bottom source/drain region 12_N, a fourth channel region 14_N2, and a fourth top source/drain region 16_N2. The second bottom source/drain region 12_N may be shared by the two first N-type VFETs and the two second N-type VFETs.

The 2-input NAND gate (i.e., 2-NAND 1) may include a first common gate layer 18_A. A first portion of the first common gate layer 18_A may be a gate electrode of each of the two first P-type VFETs P1, and a second portion of the first common gate layer 18_A may be a gate electrode of each of the two first N-type VFETs N1. As the two first P-type VFETs P1 and the two first N-type VFETs N1 share the first common gate layer 18_A, the same input (e.g., Input A in FIG. 18) may be applied to the two first P-type VFETs P1 and the two first N-type VFETs N1 as a gate input. Spacers 20 may be provided to electrically isolate the first common gate layer 18_A from the first and second bottom source/drain regions 12_P and 12_N and from the first and second top source/drain regions 16_P1 and 16_N1. The first and second bottom source/drain regions 12_P and 12_N may be electrically isolated from each other by an isolation layer 10 (e.g., a shallow trench isolation layer).

The 2-NAND 1 may also include a second common gate layer 18_B. A first portion of the second common gate layer 18_B may be a gate electrode of each of the two second P-type VFETs P2, and a second portion of the second common gate layer 18_B may be a gate electrode of the two second N-type VFETs N2. As the two second P-type VFETs P2 and the two second N-type VFETs N2 share the second common gate layer 18_B, the same input (e.g., Input B in FIG. 18) may be applied to the two second P-type VFETs P2 and the two second N-type VFETs N2 as a gate input. Spacers 20 may also be provided to electrically isolate the second common gate layer 18_B from the first and second bottom source/drain regions 12_P and 12_N and from the third and fourth top source/drain regions 16_P2 and 16_N2.

A first top contact 32_P may extend on the two first P-type VFETs P1 and the two second P-type VFETs P2. The first top contact 32_P may contact and may be electrically connected to the two first top source/drain regions 16_P1 of the first P-type VFETs P1 and the two third top source/drain regions 16_P2 of the second P-type VFETs P2. The first top contact 32_P may extend longitudinally in the second horizontal direction Y, as illustrated in FIG. 19.

A second top contact 32_N1 may be on the two first N-type VFETs N1. The second top contact 32_N1 may contact and may be electrically connected to the two second top source/drain regions 16_N1 of the first N-type VFETs N1. The second top contact 32_N1 may extend longitudinally in the second horizontal direction Y. A third top contact 32_N2 may be on the two second N-type VFETs N2. The third top contact 32_N2 may contact and may be electrically connected to the two fourth top source/drain regions 16_N2 of the second N-type VFETs N2. The second top contact 32_N1 and the third top contact 32_N2 may be spaced apart from each other in the second horizontal direction Y and may be electrically isolated from each other, as illustrated in FIG. 20A. In some embodiments, the first, second, and third top contacts 32_P, 32_N1, and 32_N2 may include metal, for example, Co, W, and/or Cu.

The 2-NAND 1 may include a first bottom contact 36_P and a second bottom contact 36_N. The first bottom contact 36_P may contact and may be electrically connected to the first bottom source/drain region 12_P, as illustrated in FIG. 20B. A first power having a first voltage (e.g., a drain voltage $V_{DD}$) may be applied to the first bottom source/drain region 12_P through the first bottom contact 36_P. The second bottom contact 36_N may contact and may be electrically connected to the third top contact 32_N2. A second power having a second voltage (e.g., a source voltage $V_{SS}$) may be applied to the fourth top source/drain regions 16_N2 through the second bottom contact 36_N and the third top contact 32_N2. Each of the first bottom contact 36_P and the second bottom contact 36_N may extend longitudinally in the second horizontal direction Y and may include metal, for example, Co, W, and/or Cu.

Still referring to FIGS. 19, 20A, and 20B, the 2-NAND 1 may include a first gate contact 34_A and a second gate contact 34_B. The first gate contact 34_A may contact the first common gate layer 18_A, and the second gate contact 34_B may contact the second common gate layer 18_B. In some embodiments, the first gate contact 34_A and the second gate contact 34_B may be spaced apart from each other in the second horizontal direction Y and may be arranged along the second horizontal direction Y, as illustrated in FIG. 19. In some embodiments, the first gate contact 34_A and the second gate contact 34_B may be aligned along the second horizontal direction Y, as illustrated in FIG. 19.

The 2-NAND 1 may include multiple via contacts 42_P, 42_N, 42_GA, and 42_GB. A first via contact 42_P may contact and may be electrically connected to the first top contact 32_P, and a second via contact 42_N may contact and may be electrically connected to the second top contact 32_N1. A first gate via contact 42_GA may contact and may be electrically connected to the first gate contact 34_A, and a second gate via contact 42_GB may contact and may be electrically connected to the second gate contact 34_B. Each of the via contacts 42_P, 42_N, 42_GA, and 42_GB may include metal, for example, Co and/or Cu.

The 2-NAND 1 may include multiple conductive lines 44_O, 44_A, and 44_B. A first conductive line 44_O may be electrically connected to the first top contact 32_P and the second top contact 32_N1 through the first via contact 42_P and the second via contact 4_2N, respectively. The 2-NAND 1 may output its output signal through the first conductive line 44_O that is electrically connected to both the first top source/drain region 16_P1 and the second top source/drain region 16_N1. Accordingly, the first conductive line 44_O may be referred to as an output conductive line. The second conductive line 44_A may be electrically connected to the first common gate layer 18_A through the first gate via contact 42_GA and the first gate contact 34_A. The third conductive line 44_B may be electrically connected to the second common gate layer 18_B through the second gate via contact 42_GB and the second gate contact 34_B. As inputs (e.g., Input A and Input B of FIG. 18) of the 2-NAND 1 may be applied through the second and third conducive lines 44_A and 44_B, each of the second and third conducive lines 44_A and 44_B may be referred to as an input conductive line. Each of the multiple conductive lines 44_O, 44_A, and 44_B may include metal, for example, Co and/or Cu.

In some embodiments, a 2-input NAND gate may output its output signal through a conductive line (i.e., an output conductive line) electrically connected to at least one of bottom source/drain regions of a P-type VFET and an N-type VFET. The at least one of bottom source/drain regions of the P-type VFET and the N-type VFET may include a portion extending into a dummy region of a substrate on which no channel region of a VFET is formed and the portion may be electrically connected to the overlying output conductive line.

Figure 21:
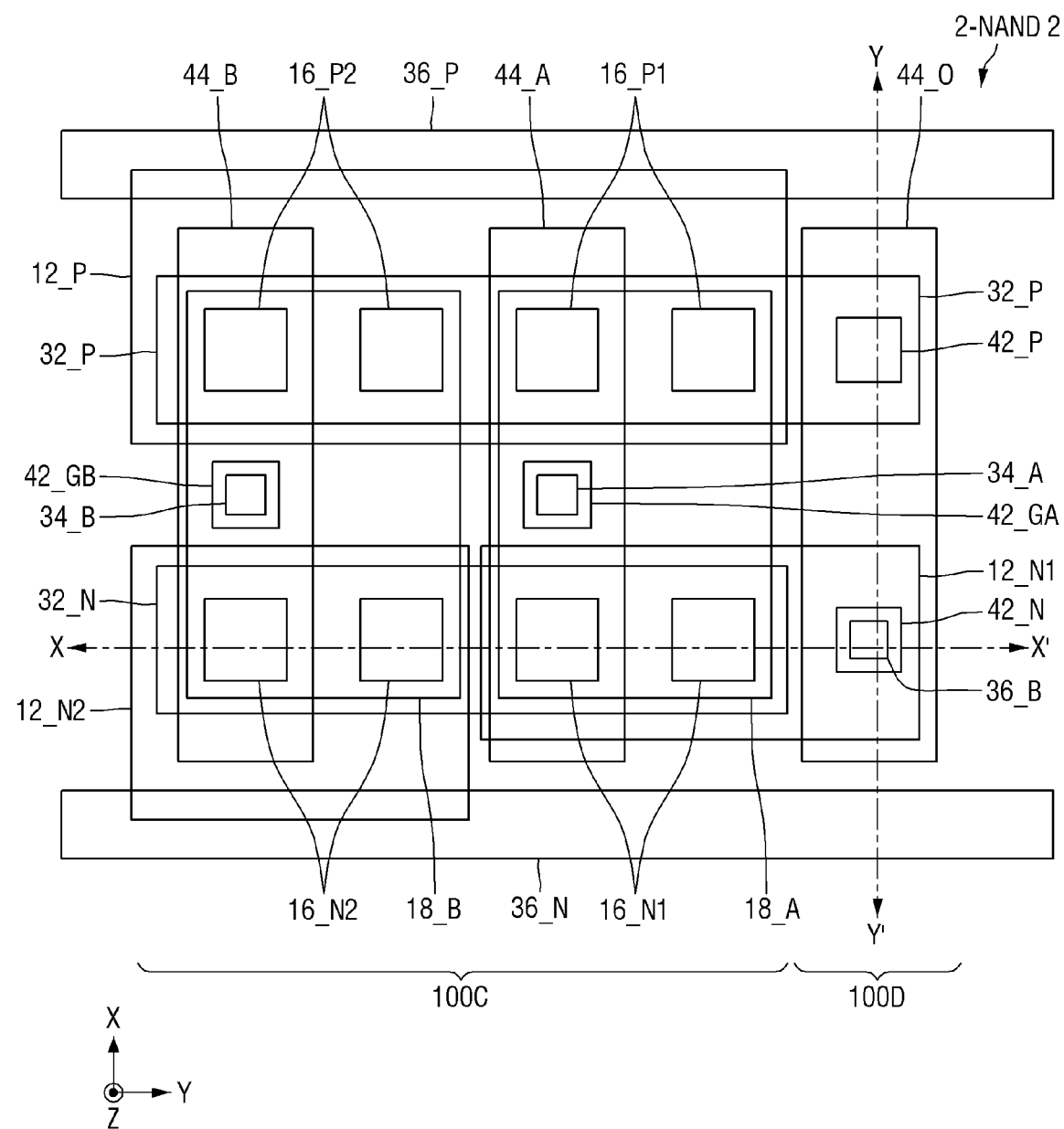
FIG. 21 is a layout of the 2-input NAND gate of FIG. 18 according to some embodiments of the present inventive concept.
Figure 22A:
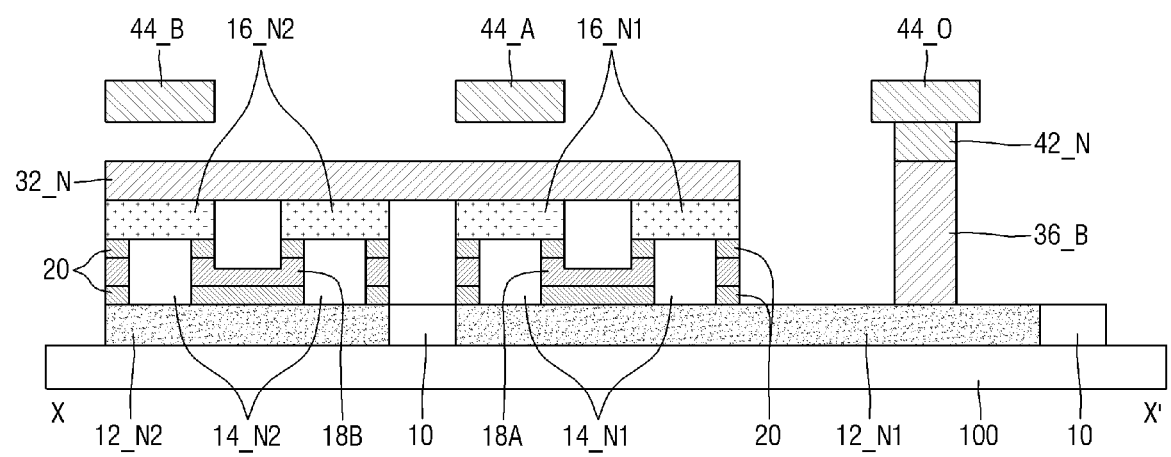
FIGS. 22A and 22B are cross-sectional views taken along the lines X-X' and Y-Y' of FIG. 21, respectively, according to some embodiments of the present inventive concept.
Figure 22B:
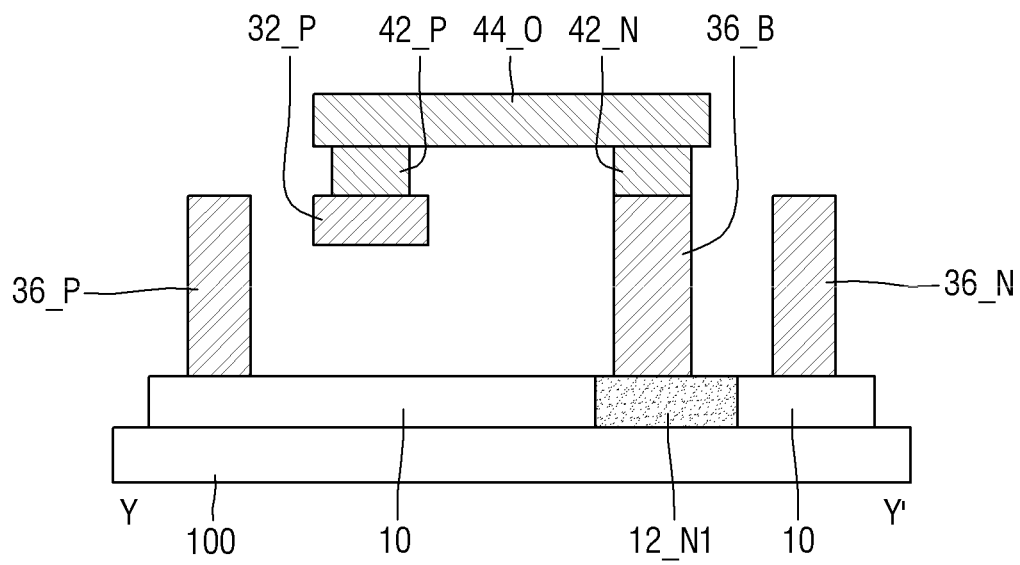

FIG. 21 is a layout of the 2-input NAND gate of FIG. 18 according to some embodiments of the present inventive concept, and FIGS. 22A and 22B are cross-sectional views taken along the lines X-X' and Y-Y' of FIG. 21, respectively, according to some embodiments of the present inventive concept.

Referring to FIGS. 21, 22A, and 22B, the substrate 100 may include the cell region 100C and the dummy region 100D that does not vertically overlap with the cell region 100C. The first P-type VFETs P1, the first N-type VFETs N1, the second P-type VFETs P2, and the second N-type VFETs N2 may be on the cell region 100C and no VFET may be provided on the dummy region 100D. A 2-input NAND gate (i.e., 2-NAND 2) shown in FIGS. 21, 22A, and 22B may be the same as or similar to the 2-NAND 1 shown in FIGS. 19, 20A, and 20B, except several elements discussed below.

The 2-NAND 2 may include a single second top contact 32_N that may electrically connect all of top source/drain regions of the first N-type VFETs N1 and the second N-type VFETs N2. In some embodiments, the second top contact 32_N may contact and may be electrically connected to all of the two second top source/drain region 16_N1 and the two fourth top source/drain region 16_N2, as illustrated in FIG. 22A.

The 2-NAND 2 may also include two separate bottom source/drain regions 12_N1 and 12_N2 for the first N-type VFETs N1 and the second N-type VFETs N2, respectively. A second bottom source/drain region 12_N1 may be shared by the two first N-type VFETs N1, and a third bottom source/drain region 12_N2 may be shared by the two second N-type VFETs N2. The second bottom source/drain region 12_N1 and the third bottom source/drain region 12_N2 may be spaced apart from each other in the second horizontal direction Y and may be electrically isolated from each other. An isolation layer 10 may be between the second bottom source/drain region 12_N1 and the third bottom source/drain region 12_N2.

The second bottom source/drain region 12_N1 may extend into the dummy region 100D, so that a portion of the second bottom source/drain region 12_N1 may be in the dummy region 100D. The third bottom source/drain region 12_N2 may extend toward the second bottom contact 36_N and may contact the second bottom contact 36_N. A second power having a second voltage (e.g., a source voltage $V_{SS}$) may be applied to the third bottom source/drain region 12_N2 through the second bottom contact 36_N.

In some embodiments, the first top contact 32_P may extend onto the dummy region 100D of the substrate 100 and thus may include a portion on the dummy region 100D. The portion of the first top contact 32_P on the dummy region 100D may be electrically connected to the first conductive line 44_O through the first via contact 42_P. The 2-NAND 2 may include a third bottom contact 36_B contacting the second bottom source/drain region 12_N1, as illustrated in FIG. 22B. The second bottom source/drain region 12_N1 may be electrically connected to the first conductive line 44_O through the third bottom contact 36_B and the second via contact 42_N. The third bottom contact 36_B may have an upper surface facing the second via contact 42_N, and the upper surface of the third bottom contact 36_B may be coplanar with upper surfaces of the first and second bottom contacts 36_P and 36_N, as illustrated in FIG. 22B. The third bottom contact 36_B and the first and second bottom contacts 36_P and 36_N may have an equal length in the vertical direction Z, as illustrated in FIG. 22B.

The 2-NAND 2 may output its output signal through the first conductive line 44_O that is electrically connected to the first top source/drain regions 16_P1 and the third top source/drain regions 16_P2 through the first via contact 42_P and the first top contact 32_P and is electrically connected to the second bottom source/drain region 12_N1 through the second via contact 42_N and the third bottom contact 36_B.

Figure 23:
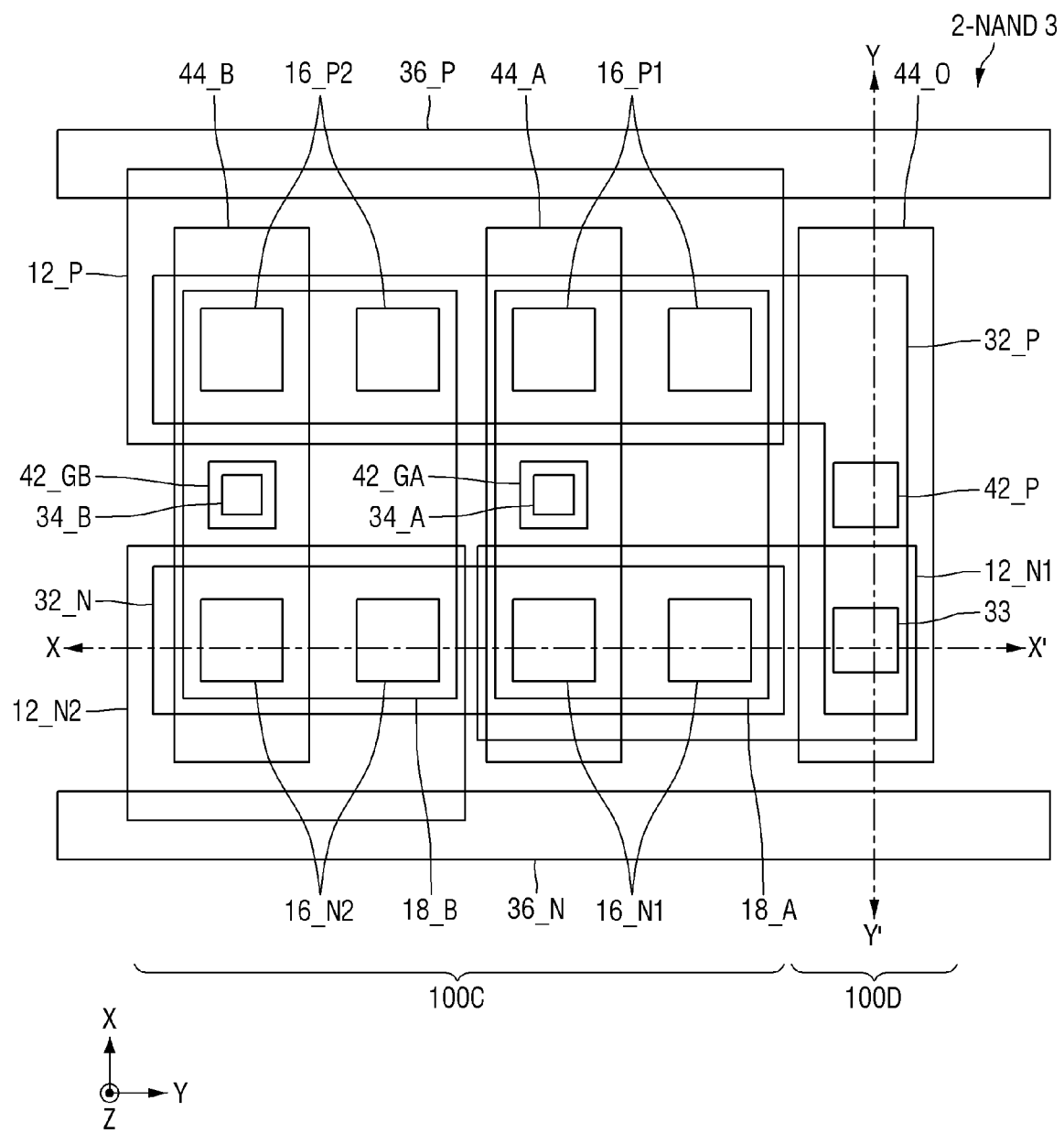
FIG. 23 is a layout of the 2-input NAND gate of FIG. 18 according to some embodiments of the present inventive concept.
Figure 24A:
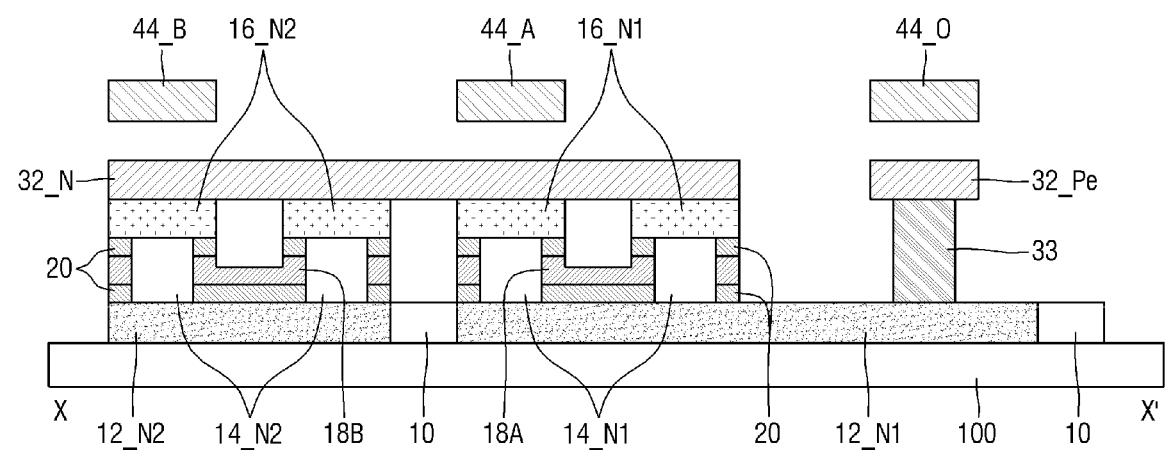
FIGS. 24A and 24B are cross-sectional views taken along the lines X-X' and Y-Y' of FIG. 23, respectively, according to some embodiments of the present inventive concept.
Figure 24B:
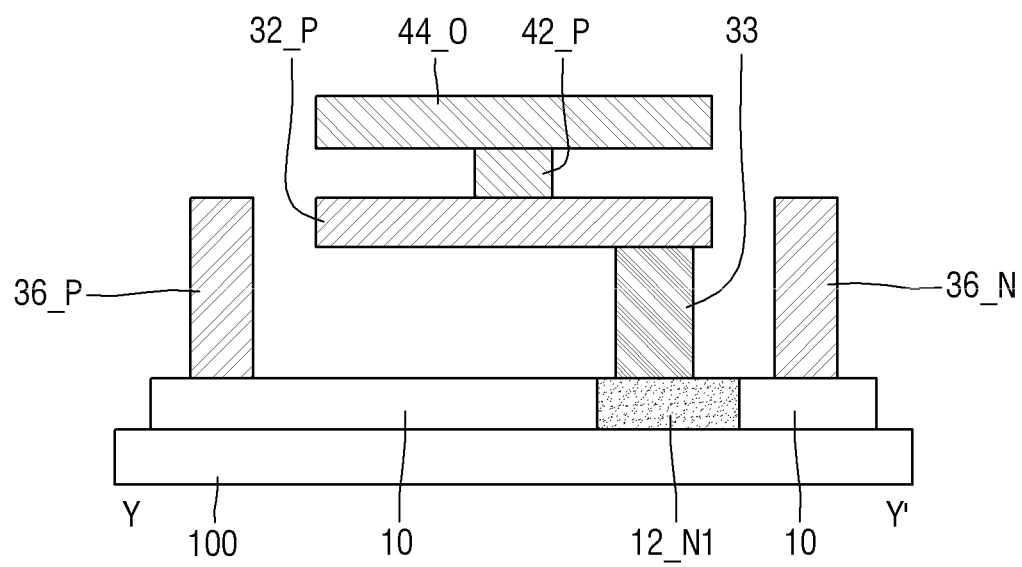

FIG. 23 is a layout of the 2-input NAND gate of FIG. 18 according to some embodiments of the present inventive concept, and FIGS. 24A and 24B are cross-sectional views taken along the lines X-X' and Y-Y' of FIG. 23, respectively, according to some embodiments of the present inventive concept. A 2-input NAND gate (i.e., 2-NAND 3) shown in FIGS. 23, 24A, and 24B may be the same as or similar to the 2-NAND 2 shown in FIGS. 21, 22A, and 22B except several elements discussed below.

Referring to FIGS. 23, 24A, and 24B, the 2-NAND 3 may include a bottom-top contact 33 contacting a portion of the second bottom source/drain 12_N1 that is on the dummy region 100D of the substrate 100. The 2-NAND 3 may also include a first top contact 32_P including an extending portion 32_Pe. The extending portion 32_Pe of the first top contact 32_P may extend toward the bottom-top contact 33 and may contact the bottom-top contact 33, as illustrated in FIG. 24B. The extending portion 32_Pe of the first top contact 32_P may extend longitudinally in the first horizontal direction X.

The first top contact 32_P may contact and may electrically connect all of the two first top source/drain regions 16_P1 of the first P-type VFETs P1, the two third top source/drain regions 16_P2 of the second P-type VFETs P2, and the bottom-top contact 33. The first top contact 32_P may be electrically connected to the first conductive line 44_O through the first via contact 42_P. Accordingly, the first conductive line 44_O may be electrically connected to the two first top source/drain regions 16_P1 of the first P-type VFETs P1, the two third top source/drain regions 16_P2 of the second P-type VFETs P2, and the second bottom source/drain region 12_N1. In some embodiments, the bottom-top contact 33, the extending portion 32_Pe of the first top contact 32_P, and the first via contact 42_P may be on the dummy region 100D of the substrate 100, as illustrated in FIG. 23.

The 2-NAND 3 may output its output signal through the first conductive line 44_O that is electrically connected to the all of the first top source/drain regions 16_P1, the third top source/drain regions 16_P2, and the second bottom source/drain region 12_N1.

Figure 25:
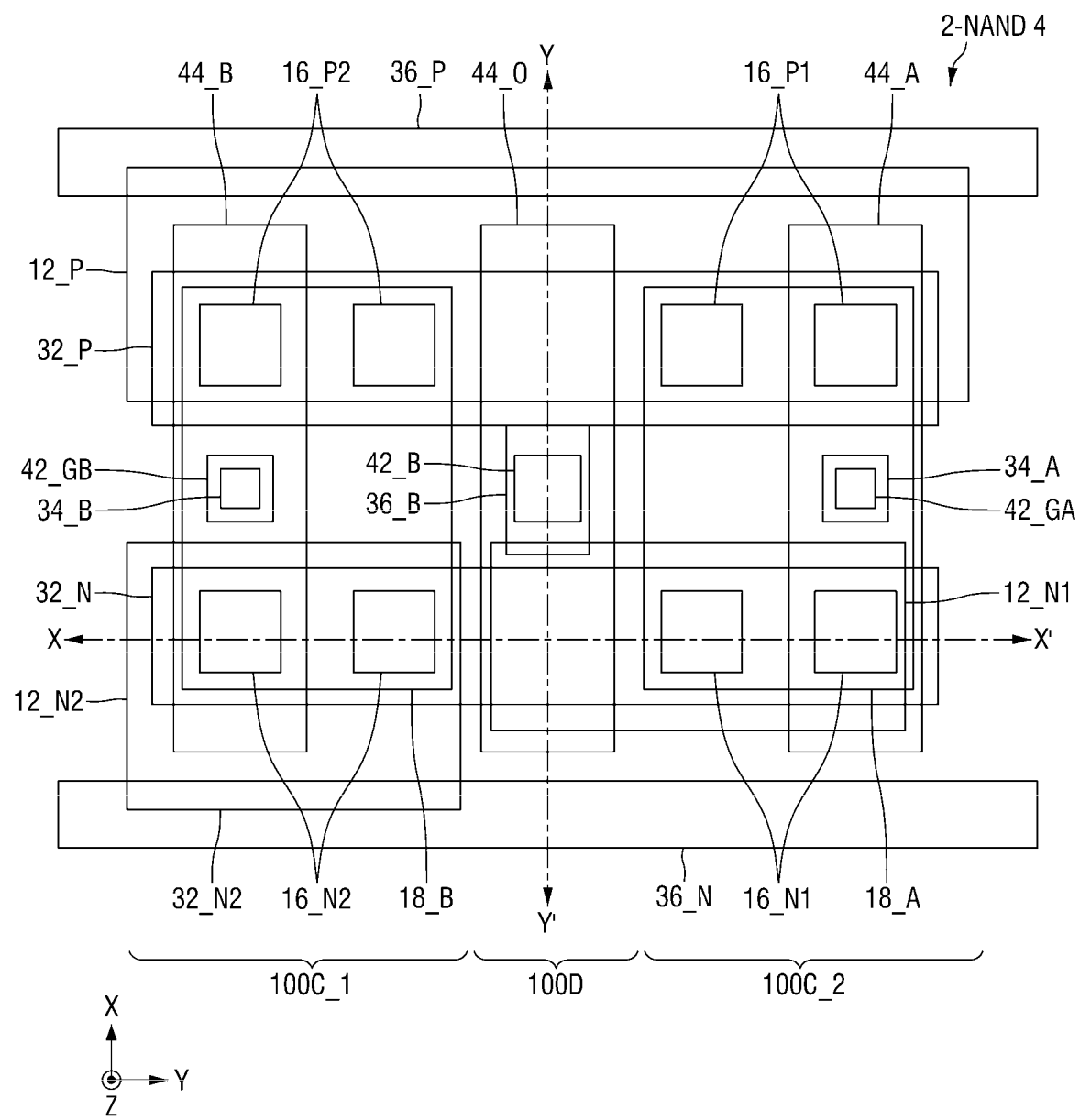
FIG. 25 is a layout of the 2-input NAND gate of FIG. 18 according to some embodiments of the present inventive concept.
Figure 26:
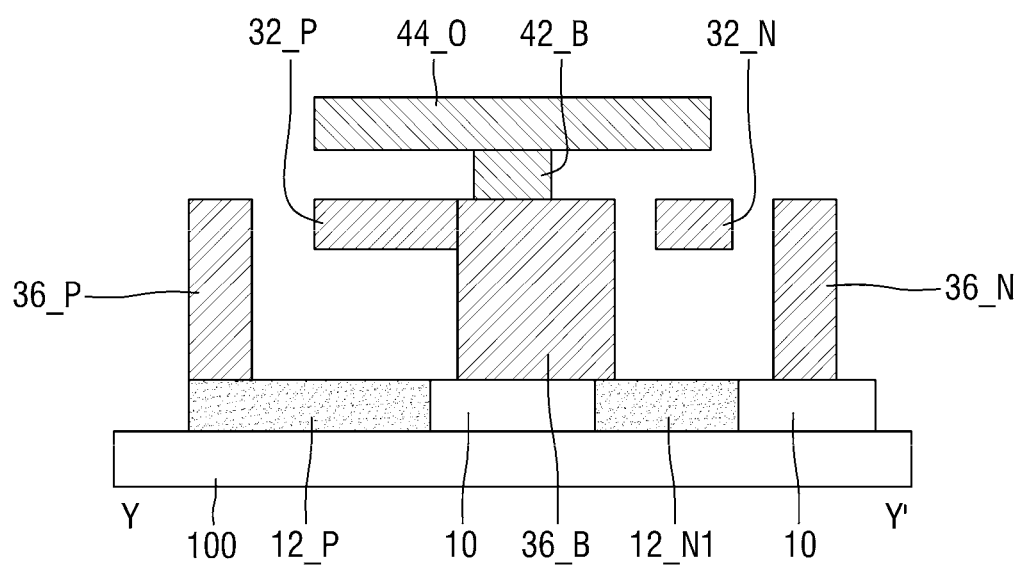
FIG. 26 is a cross-sectional view taken along the line Y-Y' of FIG. 25, according to some embodiments of the present inventive concept.

FIG. 25 is a layout of the 2-input NAND gate of FIG. 18 according to some embodiments of the present inventive concept, and FIG. 26 is a cross-sectional view taken along the line Y-Y' of FIG. 25, according to some embodiments of the present inventive concept. Referring to FIG. 25, a dummy region 100D of a substrate 100 may be between the first P-type VFETs and the second P-type VFETs and between the first N-type VFETs and the second N-type VFETs. A first cell region 100_C1 and a second cell region 100_C2 may be on sides of the dummy region 100D, respectively, as illustrated in FIG. 25.

Referring to FIGS. 25 and 26, a 2-input NAND gate (i.e., 2-NAND 4) may include a third bottom contact 36_B contacting the second bottom source/drain region 12_N1 and may extend longitudinally in the first horizontal direction X. The third bottom contact 36_B may extend toward the first top contact 32_P and may contact the first top contact 32_P. The two first top source/drain regions 16_P1 of the first P-type VFETs P1 and the two third top source/drain regions 16_P2 of the second P-type VFETs P2 may be electrically connected to the second bottom source/drain region 12_N1 through the first top contact 32_P and the third bottom contact 36_B. The third bottom contact 36_B may be electrically connected to the first conductive line 44_O through a via contact 42_B.

The 2-NAND 4 may output its output signal through the first conductive line 44_O that is electrically connected to the all of the first top source/drain regions 16_P1, the third top source/drain regions 16_P2, the second bottom source/drain region 12_N1.

Figure 27:
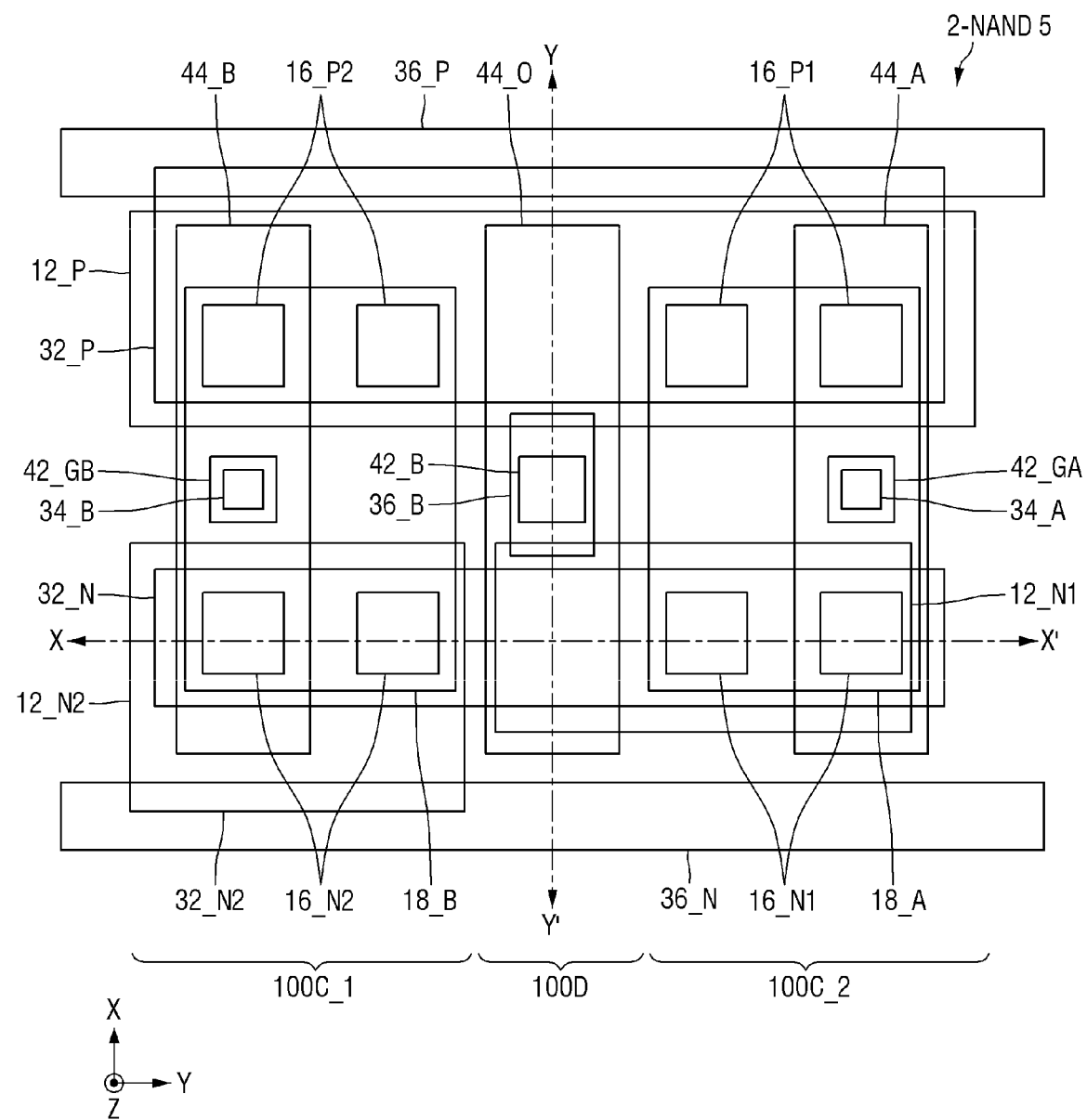
FIG. 27 is a layout of the 2-input NAND gate of FIG. 18 according to some embodiments of the present inventive concept.
Figure 28:
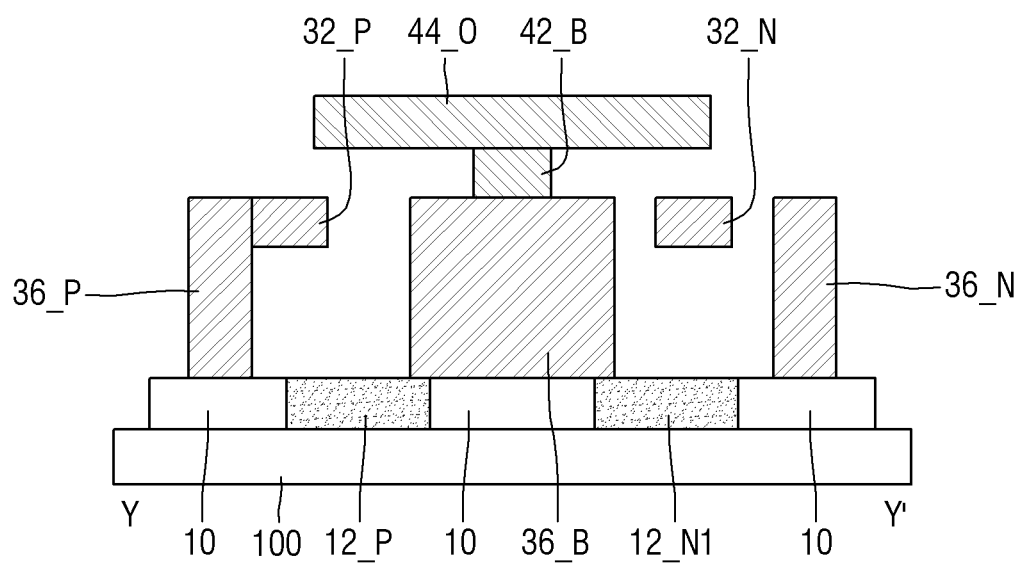
FIG. 28 is a cross-sectional view taken along the line Y-Y' of FIG. 27, according to some embodiments of the present inventive concept.

FIG. 27 is a layout of the 2-input NAND gate of FIG. 18 according to some embodiments of the present inventive concept, and FIG. 28 is a cross-sectional view taken along the line Y-Y' of FIG. 27, according to some embodiments of the present inventive concept. A 2-input NAND gate (i.e., 2-NAND 5) shown in FIGS. 27 and 28 may be the same as or similar to the 2-NAND 4 shown in FIGS. 25 and 26, except several elements discussed below.

Referring to FIGS. 27 and 28, the first top contact 32_P may be contact and may be electrically connected to the two first top source/drain regions 16_P1 of the first P-type VFETs P1 and the two third top source/drain regions 16_P2 of the second P-type VFETs P2. The first top contact 32_P may extend to the first bottom contact 36_P and may contact the first bottom contact 36_P. A first power having a first voltage (e.g., a drain voltage $V_{DD}$) may be applied to the two first top source/drain regions 16_P1 and the two third top source/drain regions 16_P2 through the first bottom contact 36_P and the first top contact 32_P. The first bottom source/drain region 12_P may be spaced apart from the first bottom contact 36_P in the first horizontal direction X.

The 2-NAND 5 may include a third bottom contact 36_B contacting both the first bottom source/drain region 12_P and the second bottom source/drain region 12_N1. The third bottom contact 36_B may be electrically connected to both the first bottom source/drain region 12_P and the second bottom source/drain region 12_N1. The third bottom contact 36_B may be electrically connected to the first conductive line 44_O through a via contact 42_B.

The 2-NAND 5 may output its output signal through the first conductive line 44_O that is electrically connected to the first bottom source/drain region 12_P and the second bottom source/drain region 12_N1.

Figure 29:
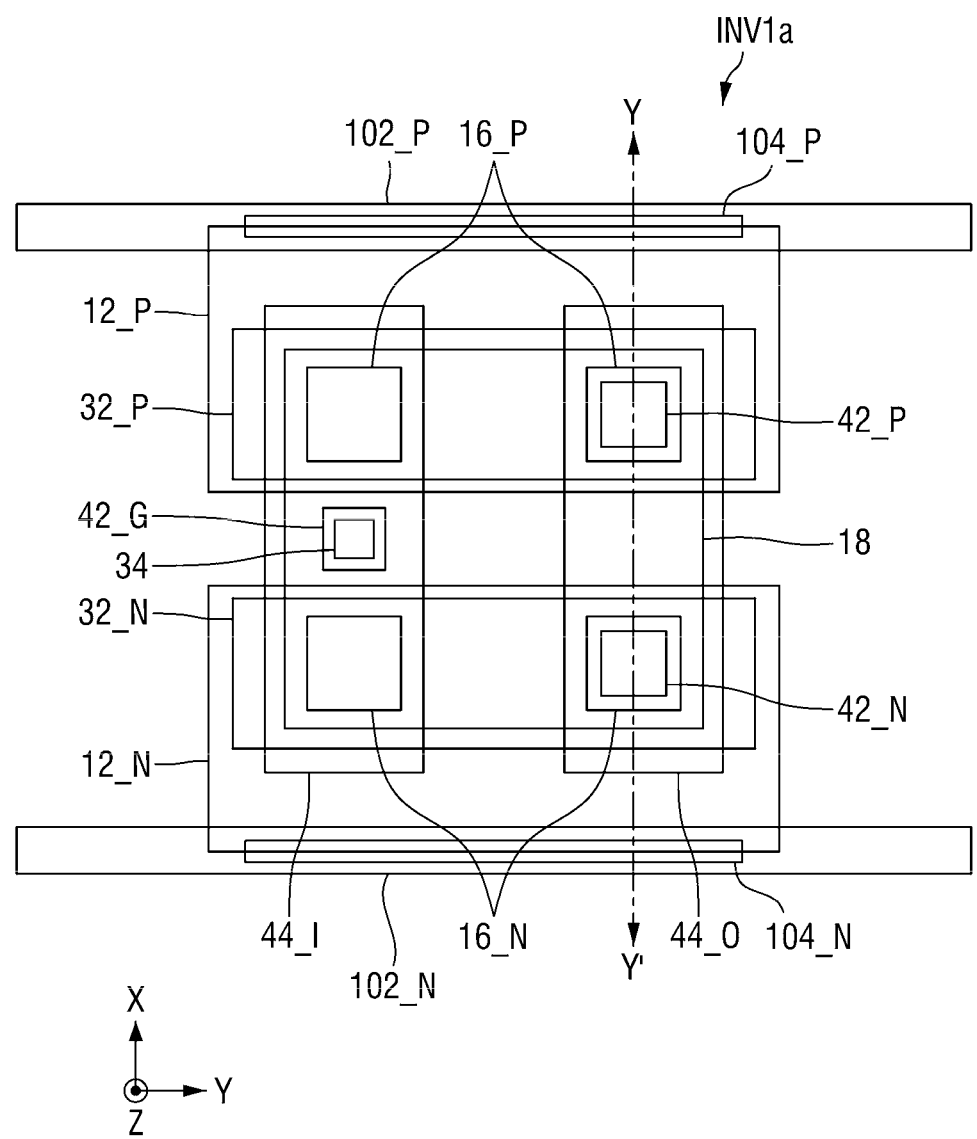
FIG. 29 is a layout of the inverter of FIG. 2B, according to some embodiments of the present inventive concept.
Figure 30:
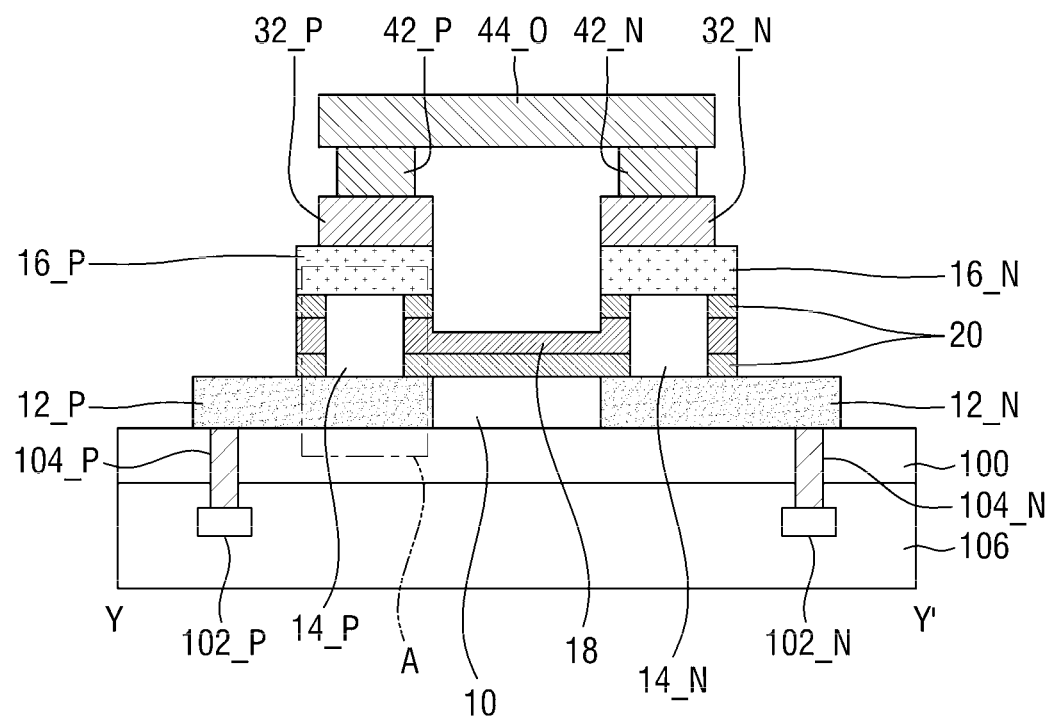
FIG. 30 is a cross-sectional view taken along the line Y-Y' of FIG. 29 according to some embodiments of the present inventive concept.

FIG. 29 is a layout of the inverter of FIG. 2B, according to some embodiments of the present inventive concept, and FIG. 30 is a cross-sectional view taken along the line Y-Y' of FIG. 29 according to some embodiments of the present inventive concept. Referring to FIGS. 29 and 30, an inverter INV 1a may be substantially the same as the INV 1 shown in FIGS. 3, 4A, and 4B except several elements discussed hereinafter.

The INV 1a may include a first buried power line 102_P and a second buried power line 102_N and may also include a first buried power via 104_P and a second buried power via 104_N. The first buried power line 102_P and the first buried power via 104_P may be electrically connected to the first bottom source/drain region 12_P, and the second buried power line 102_N and the second buried power via 104_N may be electrically connected to the second bottom source/drain region 12_N. In some embodiments, the INV 1a may also include a buried insulating layer 106 in which the first and second buried power lines 102_P and 102_N and the first and second buried power vias 104_P and 104_N are disposed.

In some embodiments, the first and second buried power vias 104_P and 104_N may directly contact the first and second bottom source/drain regions 12_P and 12_N, respectively, as shown in FIG. 30. In some embodiments, the first buried power line 102_P may be connected to a first power having a first voltage (e.g., a drain voltage $V_{DD}$), and thus the first power may be applied to the first bottom source/drain region 12_P. In some embodiments, the second buried power line 102_N may be connected to a second power having a second voltage (e.g., a source voltage $V_{SS}$), and thus the second power may be applied to the second bottom source/drain region 12_N.

In some embodiments, each of the first and second buried power lines 102_P and 102_N and the first and second buried power vias 104_P and 104_N may include metal, for example, cobalt (Co), copper (Cu), and/or ruthenium (Ru). The buried insulating layer 106 may include various insulating materials, for example, silicon oxide. In some embodiments, the buried insulating layer 106 may directly contact the substrate 100 as shown in FIG. 30. Although FIG. 30 shows the substrate 100 disposed between the first and second bottom source/drain regions 12_P and 12_N and the buried insulating layer 106, it will be understood that, in some embodiments, the substrate 100 may be omitted, and the buried insulating layer 106 may directly contact the first and second bottom source/drain regions 12_P and 12_N.

Figure 31:
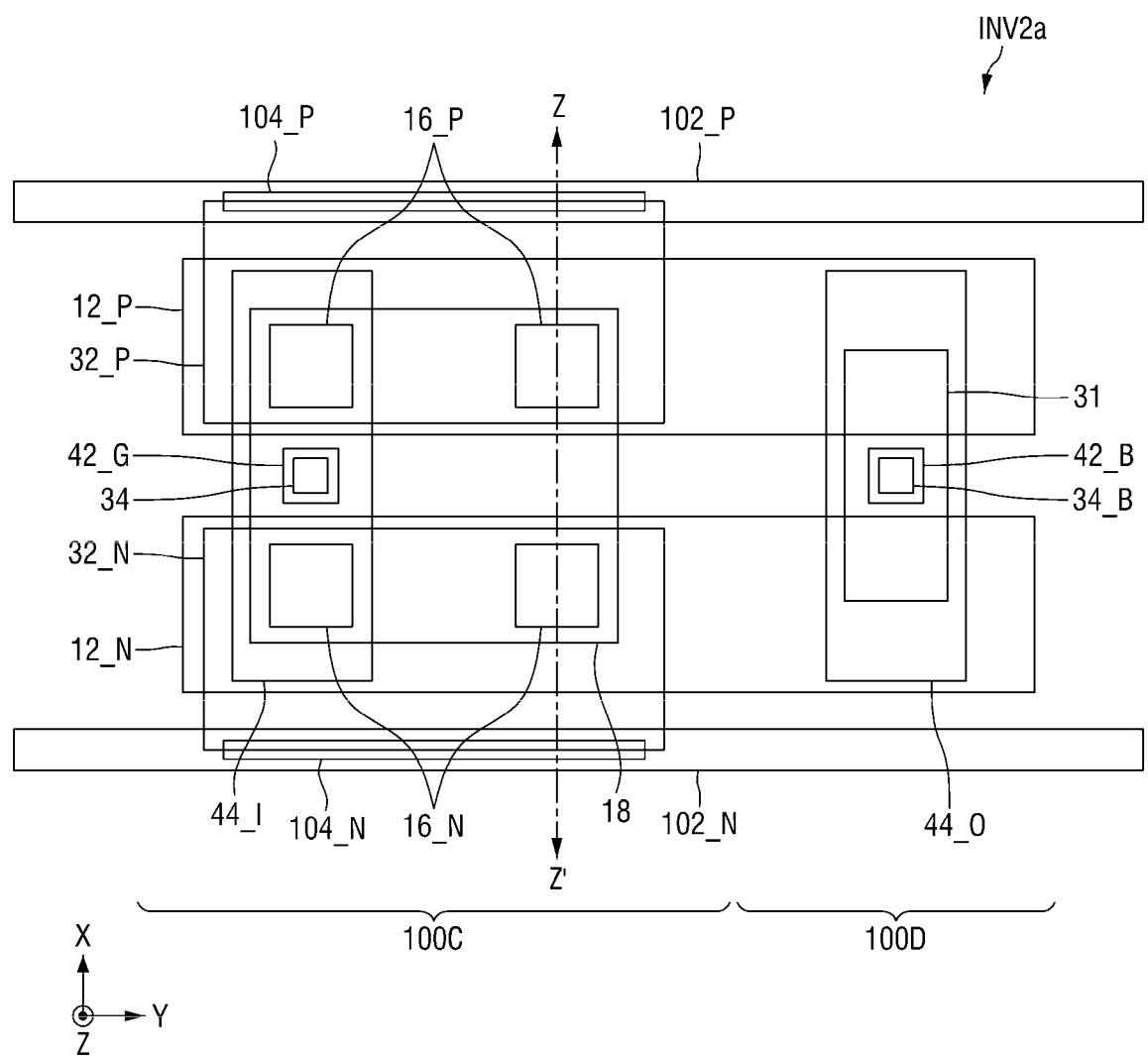
FIG. 31 is a layout of the inverter of FIG. 2B according to some embodiments of the present inventive concept.
Figure 32:
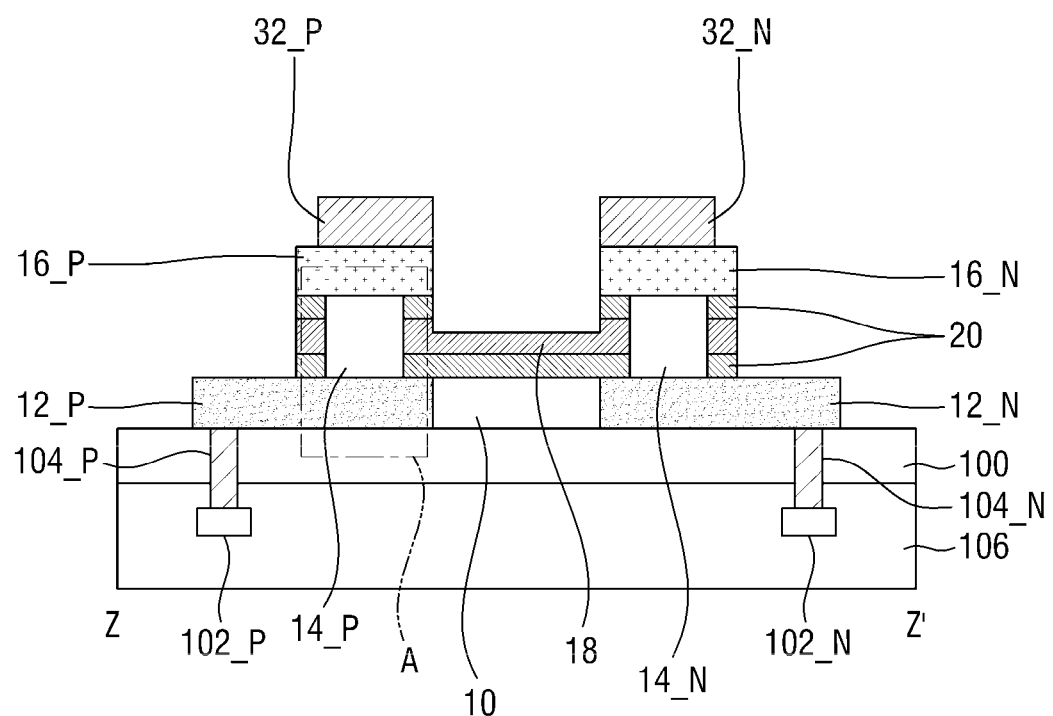
FIG. 32 is a cross-sectional view taken along the line Z-Z' of FIG. 31 according to some embodiments of the present inventive concept.

FIG. 31 is a layout of the inverter of FIG. 2B according to some embodiments of the present inventive concept, and FIG. 32 is a cross-sectional view taken along the line Z-Z' of FIG. 31 according to some embodiments of the present inventive concept. Referring to FIGS. 31 and 32, an inverter INV 2a may be substantially the same as the INV 2 shown in FIGS. 6, 7A, and 7B except several elements discussed hereinafter.

The INV 2a may include a first buried power line 102_P and a second buried power line 102_N and may also include a first buried power via 104_P and a second buried power via 104_N. The first buried power line 102_P and the first buried power via 104_P may be electrically connected to the first bottom source/drain region 12_P, and the second buried power line 102_N and the second buried power via 104_N may be electrically connected to the second bottom source/drain region 12_N. In some embodiments, the INV 2a may also include a buried insulating layer 106 in which the first and second buried power lines 102_P and 102_N and the first and second buried power vias 104_P and 104_N are disposed.

In some embodiments, the first and second buried power vias 104_P and 104_N may directly contact the first and second bottom source/drain regions 12_P and 12_N, respectively, as shown in FIG. 32. In some embodiments, the first buried power line 102_P may be connected to a first power having a first voltage (e.g., a drain voltage $V_{DD}$), and thus the first power may be applied to the first bottom source/drain region 12_P. In some embodiments, the second buried power line 102_N may be connected to a second power having a second voltage (e.g., a source voltage $V_{SS}$), and thus the second power may be applied to the second bottom source/drain region 12_N.

It will be understood that each of the INV 1a and the INV 2a may not include the first bottom contact 36_P and the second bottom contact 36_N of the INV 1 and INV 2 shown in FIGS. 3 and 6 as a first power and a second power may be applied to the first and second bottom source/drain regions 12_P and 12_N, respectively, through one of the first and second buried power lines 102_P and 102_N.

It will be also understood that each of inverters and 2-input NANDs according to some embodiments of the present inventive concept (e.g., the INV 3 through the INV 7 and the 2-NAND 1 through the 2-NAND 5) may include first and second buried power lines, first and second buried power vias, and a buried insulating layer, which are similar to or the same as, respectively, the first and second buried power lines 102_P and 102_N, the first and second buried power vias 104_P and 104_N, and the buried insulating layer 106 shown in FIGS. 29 through 32 to apply a first power having a first voltage (e.g., a drain voltage $V_{DD}$) or a second power having a second voltage (e.g., a source voltage $V_{SS}$) to its bottom source/drain region.

In some embodiments, a single chip may include multiple portions (e.g., units) having different functions (e.g., a Central Processing Unit (CPU) portion, an Application Processor (AP) portion, and a Micro Processing Unit (MPU) portion). Each of these multiple portions may include multiple standard cells. In some embodiments, all of standard cells in a single portion may receive its powers (e.g., a power having a drain voltage $V_{DD}$ and a power having a source voltage $V_{SS}$) through its top source/drain region. In some embodiments, all of standard cells in a single portion may receive its powers (e.g., a power having a drain voltage $V_{DD}$ and a power having a source voltage $V_{SS}$) through its bottom source/drain region, and the powers may be applied to the bottom source/drain region through a buried power line (e.g., the first and second buried power lines 102_P and 102_N) and a buried power via (e.g., first and second buried power vias 104_P and 104_N).

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete and will convey the scope of the disclosure to those skilled in the art. In the drawings, the sizes and relative sizes of layers and regions may be exaggerated for clarity. Like reference numbers refer to like elements throughout.

Example embodiments of the present inventive concept are described herein with reference to cross-sectional views or plan views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that references herein to "an element A vertically overlapping an element B" (or similar language) means that a vertical line intersecting both the elements A and B exists. It will be understood that although the terms first, second, etc. may be used herein to describe various elements, these elements should not be limited by these terms. These terms are only used to distinguish one element from another. Thus, a first element could be termed a second element without departing from the teachings of the present inventive concept.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A standard cell comprising:
   a first vertical field effect transistor (VFET) having a first conductivity type, wherein the first VFET comprises a first top source/drain region on a substrate, a first channel region between the first top source/drain region and the substrate, and a first bottom source/drain region in the substrate;
   a second VFET having a second conductivity type that is different from the first conductivity type, wherein the second VFET comprises a second top source/drain region on the substrate, a second channel region between the second top source/drain region and the substrate, and a second bottom source/drain region in the substrate; and
   a conductive line that is electrically connected to the first top source/drain region or the first bottom source/drain region and is electrically connected to the second bottom source/drain region,
   wherein the conductive line is spaced apart from the second top source/drain region, and
   wherein the standard cell is configured to output an output signal thereof through the conductive line.

2. The standard cell of claim 1, wherein the conductive line is electrically connected to the first bottom source/drain region.

3. The standard cell of claim 2, wherein the first top source/drain region is configured to be connected to a drain voltage $V_{DD}$ or a source voltage $V_{SS}$.

4. The standard cell of claim 1, further comprising a bottom contact contacting both the first bottom source/drain region and the second bottom source/drain region, wherein the bottom contact is electrically connected to the conductive line.

5. The standard cell of claim 1, further comprising a first bottom contact contacting the first bottom source/drain region and a second bottom contact contacting the second bottom source/drain region, wherein the first bottom contact and the second bottom contact are electrically connected to the conductive line.

6. The standard cell of claim 1, wherein the first bottom source/drain region and the second bottom source/drain region comprise a first portion and a second portion of a merged bottom source/drain region, respectively, such that the first bottom source/drain region and the second bottom source/drain region are electrically connected to each other.

7. The standard cell of claim 1, further comprising:
   a top contact contacting the first top source/drain region; and
   a bottom contact contacting the second bottom source/drain region,
   wherein the conductive line is electrically connected to the top contact and the bottom contact.

8. The standard cell of claim 7, wherein the top contact extends toward the bottom contact and contacts the bottom contact.

9. The standard cell of claim 1, further comprising a common gate layer that comprises a first portion comprising a first gate electrode of the first VFET and a second portion comprising a second gate electrode of the second VFET.

10. The standard cell of claim 1, wherein the first VFET and the second VFET are connected in series.

11. The standard cell of claim 1, wherein:
the substrate comprises a cell region and a dummy region;
the first top source/drain region and the first channel region are on the cell region of the substrate, and the first bottom source/drain region is in the cell region of the substrate;
the second top source/drain region and the second channel region are on the cell region of the substrate, the second bottom source/drain region is in the cell region of the substrate, and the second bottom source/drain region extends into the dummy region of the substrate and comprises a connecting portion in the dummy region of the substrate;
the standard cell further comprises an output contact on the dummy region of the substrate; and
the output contact contacts the connecting portion of the second bottom source/drain region.

12. The standard cell of claim 11, further comprising an isolation layer extending between the first bottom source/drain region and the second bottom source/drain region.

13. The standard cell of claim 12, wherein the connecting portion of the second bottom source/drain region comprises a second connecting portion,
wherein the first bottom source/drain region extends into the dummy region of the substrate and comprises a first connecting portion in the dummy region of the substrate, and
wherein the output contact contacts the first connecting portion of the first bottom source/drain region and the isolation layer.

14. The standard cell of claim 11, wherein the conductive line is on the output contact,
wherein the connecting portion of the second bottom source/drain region comprises a second connecting portion,
wherein the first bottom source/drain region extends into the dummy region of the substrate and comprises a first connecting portion in the dummy region of the substrate,
wherein the output contact comprises a first output contact contacting the first connecting portion of the first bottom source/drain region and a second output contact contacting the second connecting portion of the second bottom source/drain region, and
wherein the conductive line is electrically connected to both the first output contact and the second output contact.

15. The standard cell of claim 11, wherein the output contact is between the conductive line and the substrate, and the conductive line is electrically connected to the output contact.

16. A standard cell comprising:
a first vertical field effect transistor (VFET) having a first conductivity type, wherein the first VFET comprises a first top source/drain region on a substrate, a first channel region between the first top source/drain region and the substrate, and a first bottom source/drain region in the substrate;
a second VFET having a second conductivity type that is different from the first conductivity type, wherein the second VFET comprises a second top source/drain region on the substrate, a second channel region between the second top source/drain region and the substrate, and a second bottom source/drain region in the substrate;
a conductive line that is electrically connected to the first bottom source/drain region and the second bottom source/drain region; and
a bottom contact contacting both the first bottom source/drain region and the second bottom source/drain region, wherein the bottom contact is electrically connected to the conductive line.

17. The standard cell of claim 16, wherein the standard cell is configured to output an output signal thereof through the conductive line.

18. A standard cell comprising:
a first vertical field effect transistor (VFET) having a first conductivity type, wherein the first VFET comprises a first top source/drain region on a substrate, a first channel region between the first top source/drain region and the substrate, and a first bottom source/drain region in the substrate;
a second VFET having a second conductivity type that is different from the first conductivity type, wherein the second VFET comprises a second top source/drain region on the substrate, a second channel region between the second top source/drain region and the substrate, and a second bottom source/drain region in the substrate;
a conductive line that is electrically connected to the first top source/drain region and the second bottom source/drain region;
a top contact contacting the first top source/drain region; and
a bottom contact contacting the second bottom source/drain region,
wherein the conductive line is electrically connected to the top contact and the bottom contact.

19. The standard cell of claim 18, wherein the standard cell is configured to output an output signal thereof through the conductive line.

20. The standard cell of claim 18, wherein the top contact contacts the bottom contact.

* * * * *